United States Patent
Kawamura et al.

(10) Patent No.: US 9,820,047 B2
(45) Date of Patent: Nov. 14, 2017

(54) SIGNAL PROCESSING METHOD AND SPEAKER SYSTEM

(71) Applicant: Panasonic Intellectual Property Management Co., Ltd., Osaka (JP)

(72) Inventors: Akihisa Kawamura, Osaka (JP); Toshiyuki Matsumura, Osaka (JP); Isao Kakuhari, Nara (JP); Shuji Saiki, Nara (JP); Satoshi Takayama, Mie (JP); Kazuki Honda, Osaka (JP); Takafumi Yuasa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/246,933

(22) Filed: Aug. 25, 2016

(65) Prior Publication Data
US 2017/0064448 A1    Mar. 2, 2017

Related U.S. Application Data

(60) Provisional application No. 62/212,768, filed on Sep. 1, 2015.

(30) Foreign Application Priority Data

May 18, 2016    (JP) .................................. 2016-099991

(51) Int. Cl.
*H04R 3/04* (2006.01)
*H04R 29/00* (2006.01)
(Continued)

(52) U.S. Cl.
CPC .................. *H04R 3/04* (2013.01); *H04R 1/08* (2013.01); *H04R 3/12* (2013.01); *H04R 29/002* (2013.01); *H03G 5/165* (2013.01)

(58) Field of Classification Search
CPC ... H04R 3/04; H04R 3/12; H04R 1/08; H04R 29/002; H03G 5/165
(Continued)

(56) References Cited

U.S. PATENT DOCUMENTS 8,130,967 B2 *    3/2012    Kino ....................... H04S 7/301
                                                     381/58
8,488,802 B2 *    7/2013    Ohashi .................... H04S 7/305
                                                     381/56
(Continued)

FOREIGN PATENT DOCUMENTS

JP    2006-502657    1/2006
WO    2004/034732    4/2004

*Primary Examiner* — David Ton
(74) *Attorney, Agent, or Firm* — Greenblum & Bernstein, P.L.C.

(57) ABSTRACT

A method is provided for causing a processor included in a speaker system to execute operations. The operations include acquiring, using a measurement microphone, reflected sound information regarding an effect of sounds that are played back by a plurality of speakers having predetermined directivity and that are reflected off an object, where the plurality of speakers are included in the speaker system. The operations also include calculating correction coefficients used to correct acoustic characteristics of the plurality of speakers on the basis of the acquired reflected sound information. The operations further include correcting the acoustic characteristics of the plurality of speakers using the calculated correction coefficients.

10 Claims, 23 Drawing Sheets

(51) Int. Cl.
*H04R 1/08* (2006.01)
*H04R 3/12* (2006.01)
*H03G 5/16* (2006.01)

(58) Field of Classification Search
USPC .................................. 381/56, 59, 61, 63, 66
See application file for complete search history.

(56) References Cited

U.S. PATENT DOCUMENTS

| | | | | |
|---|---|---|---|---|
| 8,798,274 | B2* | 8/2014 | Sakai | H04S 7/301 |
| | | | | 381/17 |
| 2005/0169485 | A1* | 8/2005 | Ohta | G10K 15/12 |
| | | | | 381/63 |
| 2007/0036366 | A1* | 2/2007 | Konagai | H04R 3/12 |
| | | | | 381/61 |
| 2015/0237446 | A1* | 8/2015 | Katayama | H04R 1/323 |
| | | | | 381/163 |
| 2015/0263692 | A1* | 9/2015 | Bush | H03G 5/165 |
| | | | | 381/122 |

* cited by examiner

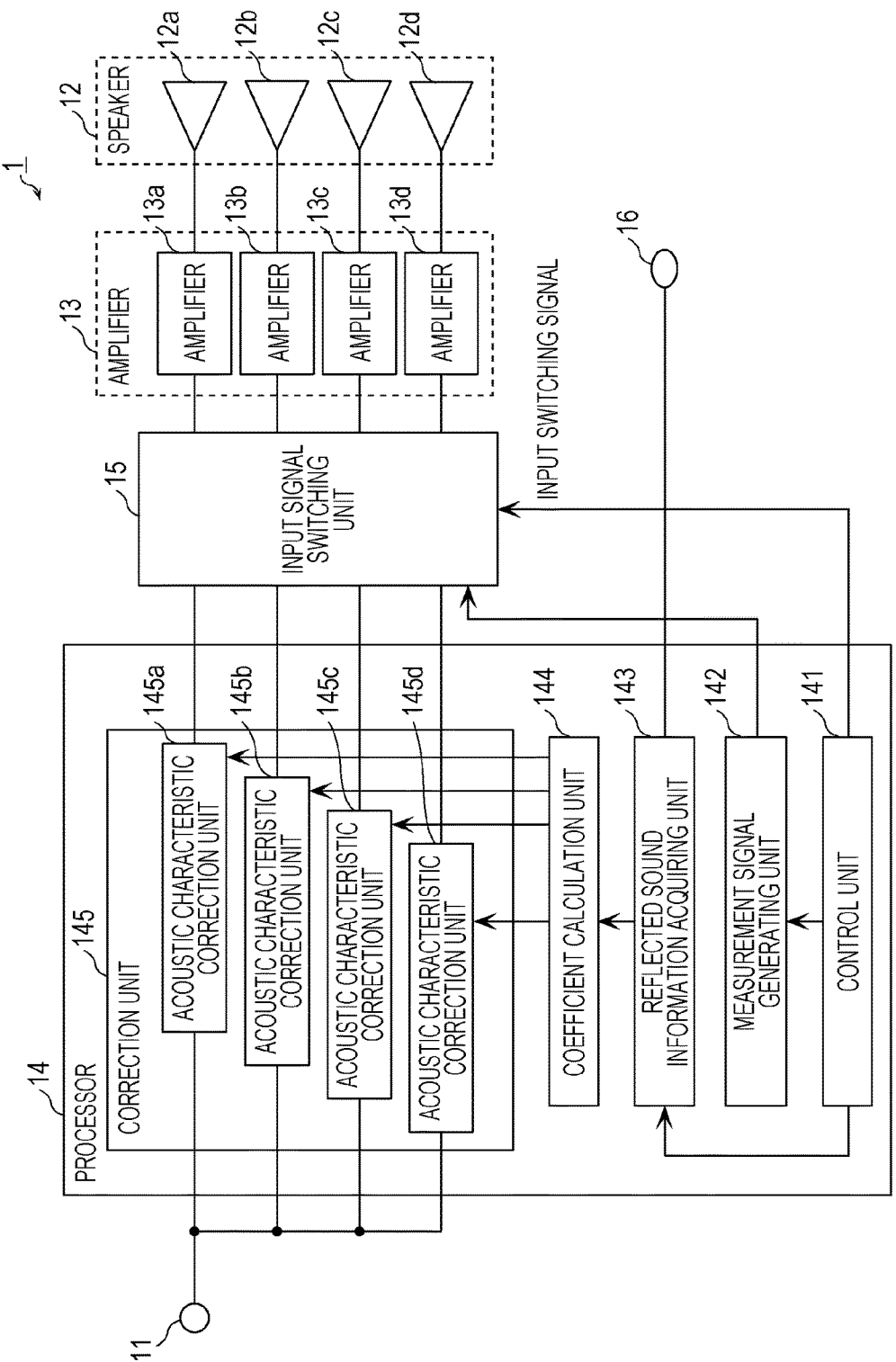

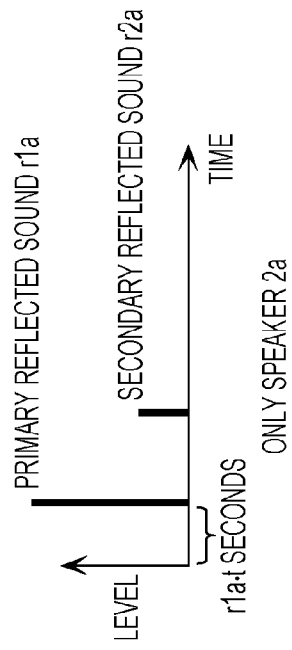
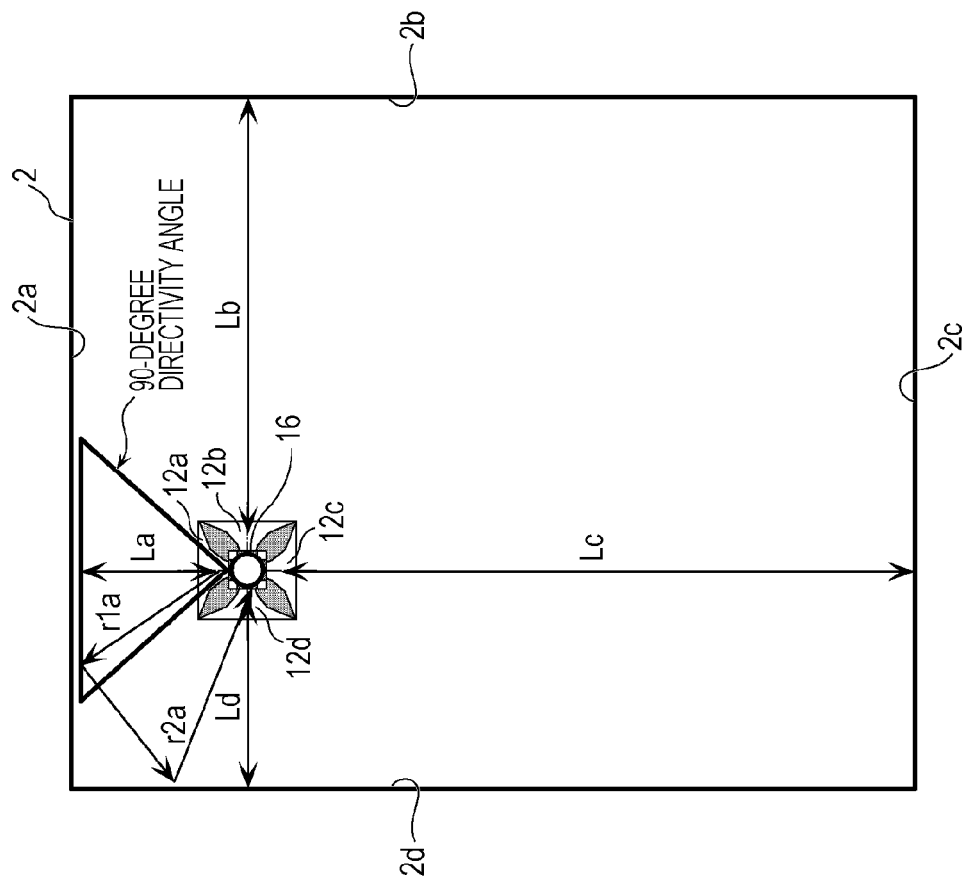

FIG. 8

|  | CORRECTION COEFFICIENT (LEVEL) |
|---|---|
| ACOUSTIC CHARACTERISTIC CORRECTION UNIT 145a | 0.1 |
| ACOUSTIC CHARACTERISTIC CORRECTION UNIT 145b | 1.0 |
| ACOUSTIC CHARACTERISTIC CORRECTION UNIT 145c | 1.0 |
| ACOUSTIC CHARACTERISTIC CORRECTION UNIT 145d | 0.2 |

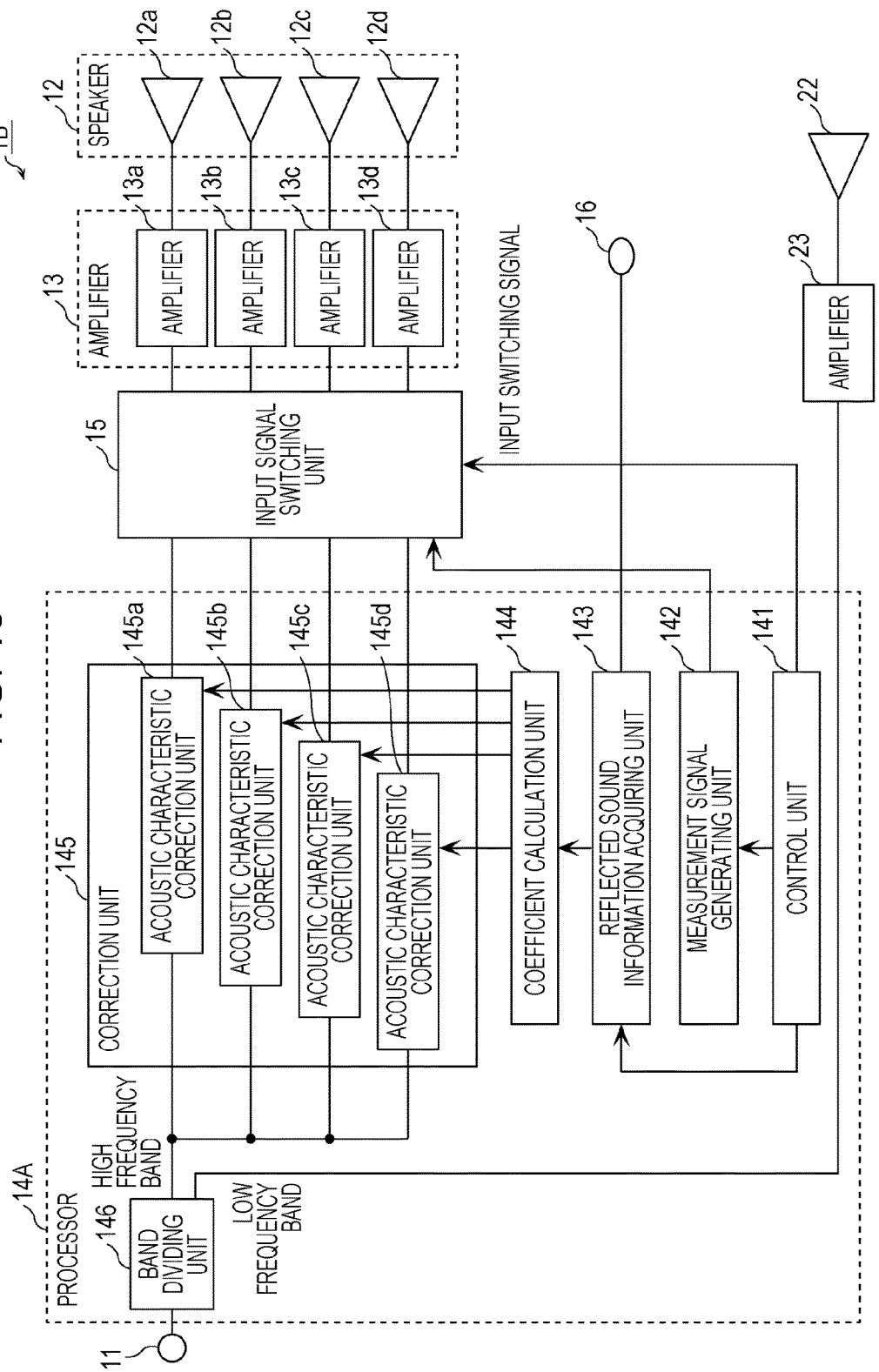

SOUND PRESSURE LEVEL (dB)

SIGNAL PROCESSING METHOD AND SPEAKER SYSTEM

BACKGROUND

1. Technical Field

The present disclosure relates to a signal processing method and a speaker system and, in particular, to a speaker system that plays back music in a desired space and a signal processing method for use in the speaker system.

2. Description of the Related Art

For example, PCT Japanese Unexamined Patent Application Publication (Translation of PCT Application) No. 2006-502657 describes an audio playback system that includes a diffuser mounted on top of a speaker facing upward to scatter sound in all directions and that reflects the sound in all directions in a horizontal plane. Thus, the audio playback system can provide the uniform frequency characteristic in all directions, so that the sound quality is not degraded at any listener's position in a room.

SUMMARY

However, according to the configuration described in PCT Japanese Unexamined Patent Application Publication (Translation of PCT Application) No. 2006-502657, if a sound-reflecting object, such as a wall, is present within the range of directivity, the frequency characteristic is significantly affected by the reflected sound and, thus, the sound quality is degraded.

One non-limiting and exemplary embodiment provides a signal processing method and a speaker system capable of reducing the effect of reflected sound on the acoustic characteristics.

In one general aspect, the techniques disclosed here feature a method causing a processor included in a speaker system including a plurality of speakers each having certain directivity to execute operations that includes acquiring, using a measurement microphone, reflected sound information regarding an effect of sounds that are played back by a plurality of speakers having predetermined directivity and that are reflected off an object, where the plurality of speakers are included in the speaker system, calculating correction coefficients used to correct acoustic characteristics of the plurality of speakers on the basis of the acquired reflected sound information, and correcting the acoustic characteristics of the plurality of speakers using the calculated correction coefficients.

According to the present disclosure, a signal processing method and a speaker system capable of reducing the effect of reflected sound on the acoustic characteristics can be provided.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 illustrates an example of the configuration of a speaker system according to a first exemplary embodiment;

FIG. 5A illustrates a method for estimating the position of a speaker and the shape of a room according to the first exemplary embodiment;

FIG. 5B illustrates the method for estimating the position of a speaker and the shape of a room according to the first exemplary embodiment;

FIG. 8 illustrates an example of a correction coefficient according to the first exemplary embodiment;

FIG. 16 illustrates an example of the configuration of a speaker system according to a second exemplary embodiment;

DETAILED DESCRIPTION

Underlying Knowledge Forming Basis of the Present Disclosure

For example, in general, a listener who is listening to the sound of music played back using a speaker system placed in a desired space, such as a room, wants to listen to good sound (sound having an undegraded quality) regardless of the location of the listener in the room. The sound that is excellent regardless of the location of the listener in the room is defined as sound which is output from the speaker system and which the listener can listen to with uniform acoustic characteristics at any listening position in a wide range of the room.

In the configuration described in PCT Japanese Unexamined Patent Application Publication (Translation of PCT Application) No. 2006-502657, an audio playback system that includes a diffuser mounted immediately above a speaker facing straight upwards to scatter sound in all directions and that reflects the sound in all directions in a horizontal plane is described. Thus, the audio playback system can provide a uniform frequency characteristic in all directions, so that the sound quality is not degraded wherever the listener is located inside of the room.

Figure 20:
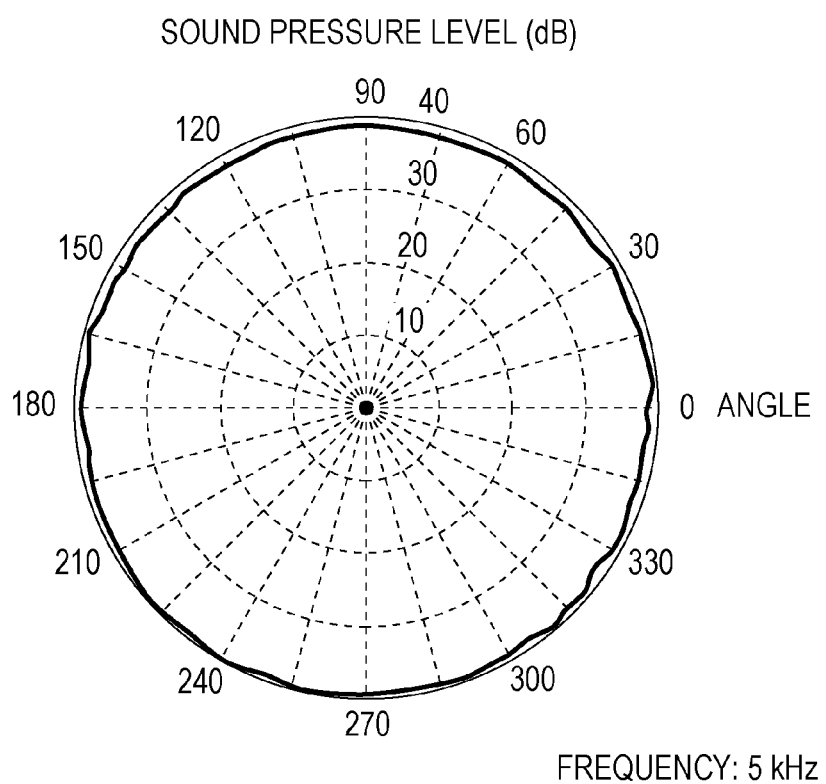
FIG. 20 illustrates the polar pattern of an existing speaker.

FIG. 20 illustrates the polar pattern of the speaker described in PCT Japanese Unexamined Patent Application Publication (Translation of PCT Application) No. 2006-502657. That is, in FIG. 20, the polar pattern of a shape that can provide uniform directivity of the sound from the speaker in a wide region is illustrated, which indicates that the speaker has omnidirectional characteristics.

In addition, PCT Japanese Unexamined Patent Application Publication (Translation of PCT Application) No. 2006-502657 describes the structure of a speaker having a diffuser of a unique shape. The diffuser provides the speaker with wide-angle directivity only in front of the speaker to reduce the effect of reflection of the sound off the wall when the speaker is placed in front of a wall so as to face the wall. The structure prevents unwanted reflection, such as reflection from a wall at the rear of the speaker and, thus, uniform directivity can be obtained in the wide area in front of the speaker. Accordingly, the listener can hear the sound with uniform acoustic characteristics within the range in which the directivity is controlled.

However, according to the structure described in PCT Japanese Unexamined Patent Application Publication (Translation of PCT Application) No. 2006-502657, if a sound-reflecting object, such as a wall, is present within the directivity range, the frequency characteristics are significantly distorted due to the effect of the reflected sound and, thus, the sound quality is degraded. Such an issue is described in detail below with reference to FIGS. 21 to 22 and FIGS. 23A and 23B.

Figure 21:
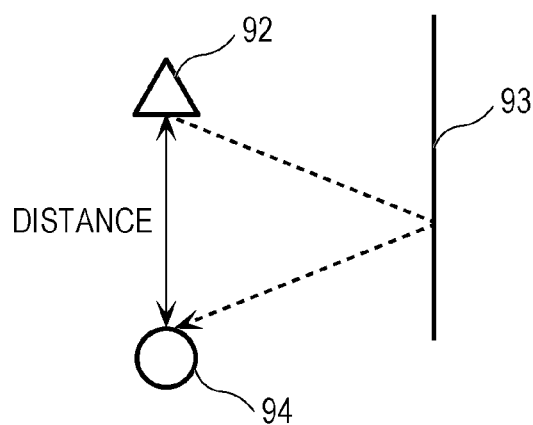
FIG. 21 illustrates issues related to a speaker having an existing structure.
Figure 22:
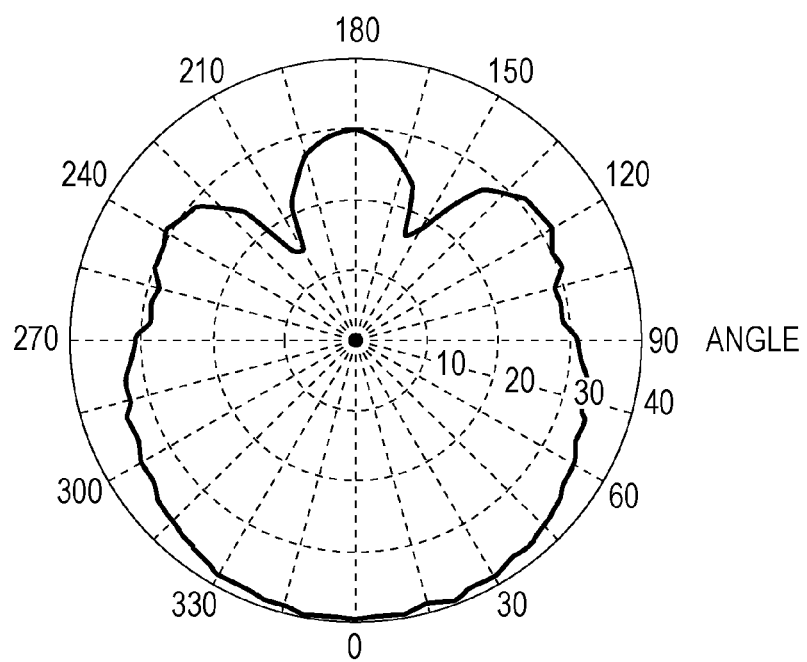
FIG. 22 illustrates the polar pattern of the speaker having the existing structure illustrated in FIG. 21.
Figure 23B:
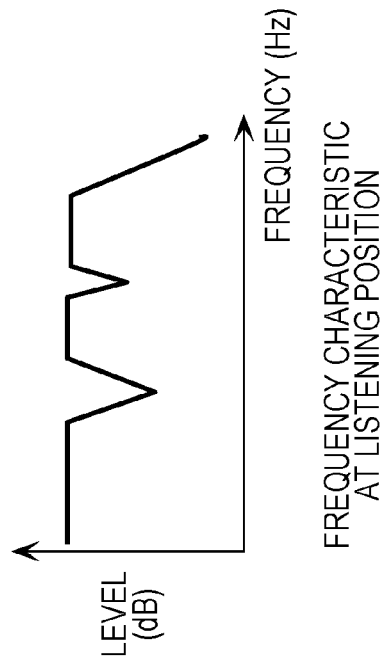
FIG. 23B illustrates the frequency characteristic of the speaker measured at the listening position illustrated in FIG. 21.
Figure 23A:
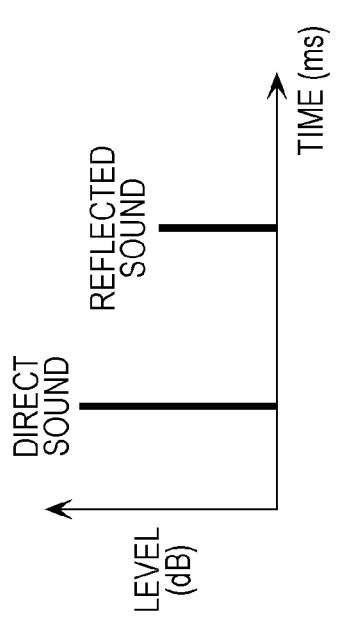
FIG. 23A illustrates the time response of the speaker measured at the listening position illustrated in FIG. 21.

FIG. 21 illustrates the issues related to a speaker 92 having an existing structure. FIG. 22 illustrates the polar pattern of the speaker 92 having an existing structure illustrated in FIG. 21. FIG. 23A illustrates the time response of the speaker 92 measured at a listening position 94 illustrated in FIG. 21. FIG. 23B illustrates the frequency characteristic of the speaker 92 measured at the listening position 94 illustrated in FIG. 21.

As illustrated in FIG. 21, if the speaker 92 having an existing structure and the polar pattern illustrated in FIG. 22 is placed near a wall 93 serving as a reflective object (a sound-reflecting object), the listener at the listening position 94 also receives large reflected sound from the wall 93.

Accordingly, if, as illustrated in FIG. 21, the wall 93 is present on the side of the speaker 92, direct sound and the reflected sound from the wall 93 reach the listening position 94. Thus, the sound having the time response illustrated in FIG. 23A and the frequency characteristic illustrated in FIG. 23B is received at the listening position 94. That is, the sound received at the listening position 94 has periodical dips in the frequency response curve, as illustrated in FIG. 23B. Accordingly, the effect of the reflected sound is significant depending on the listening position 94. Thus, as illustrated in FIG. 23A, distortion, such as a large dip, appears in the frequency characteristic, and the uniform acoustic characteristics cannot be obtained. As a result, the sound quality is degraded.

In addition, in an existing technique, to address such an issue, the wall 93 is formed from a sound absorbing material (an acoustic absorbent) so that the effect of the reflected sound is reduced. However, such an existing technique is not easy to use.

Accordingly, the present inventor conceived the idea of a signal processing method and a wide directivity speaker system having a less complicated structure and capable of reducing the effect of unwanted reflected sound reflected off a wall on the acoustic characteristics regardless of the location of a speaker and the listening position to obtain excellent acoustic characteristics.

That is, according to an aspect of the present disclosure, a signal processing method causing a processor included in a speaker system to execute operations is provided. The speaker system includes a plurality of speakers each having a certain directivity. The operations include acquiring, using a measurement microphone, reflected sound information regarding an effect of sounds that are played back by the speakers and that are reflected off an object, calculating correction coefficients used to correct acoustic characteristics of the plurality of speakers on the basis of the acquired reflected sound information, and correcting the acoustic characteristics of the plurality of speakers using the calculated correction coefficients.

In this manner, a signal processing method capable of reducing the effect of the reflected sound on the acoustic characteristics can be provided.

In addition, for example, the measurement microphone may be disposed at a position at which the plurality of speakers are located. The calculating correction coefficients may involve estimating a shape of a room having the plurality of speakers disposed therein and surrounded by walls and speaker positions at which the speakers are disposed and calculating the correction coefficient for each of the speakers using the shape of the room and the speaker positions.

In addition, for example, in the estimating a shape of a room and speaker positions, a listening position in the shape of the room may be further estimated using the estimated shape of the room and the estimated speaker positions, and response times of sounds played back by the plurality of speakers may be estimated. The signal processing method may further include adding reverb of the sounds played back by the plurality of speakers at the listening position by controlling a delay time and a sound level of the speaker that faces the wall of the room among the plurality of speakers on the basis of the estimated shape of the room, speaker positions, listening position, and response times.

In addition, for example, the speaker system may further include a woofer that differs from the plurality of speakers. The signal processing method may further include dividing a frequency range of a signal input to be played back by the plurality of speakers and the woofer into at least a low frequency band and a high frequency band. In the dividing a frequency range, a divided signal in the high frequency band may be output to the plurality of speakers, and a divided signal in the low frequency band may be output to the woofer.

In addition, for example, the acquiring reflected sound information may involve receiving input of a distance between each of the plurality of speakers and the object in a sound radiation direction of the speaker and the listening position and calculating, as the reflected sound information, estimated reflected sound representing the sound that us played back by each of the plurality of speakers and that is reflected off the object using the received distance and the received listening position.

In addition, for example, the acoustic characteristics of the plurality of speakers may include at least one of a phase, a sound level, and a frequency characteristic of each of the plurality of speakers.

In addition, for example, a speaker system according to another aspect of the present disclosure is a speaker system including a plurality of speakers each having a certain directivity. The speaker system includes a reflected sound information acquiring unit that acquires, using a measurement microphone, reflected sound information regarding an effect of sounds that are played back by the plurality of speakers and that are reflected off an object, a coefficient calculation unit that calculates correction coefficients used to correct the acoustic characteristics of the plurality of speakers on the basis of the reflected sound information acquired by the reflected sound information acquiring unit, and a correction unit that corrects the acoustic characteristics of the plurality of speakers using the correction coefficients calculated by the coefficient calculation unit.

Note that each of the embodiments described below is a specific example of the present disclosure. A value, a shape, a constituent element, steps, and the sequence of the steps described in the embodiments are only examples and shall not be construed as limiting the scope of the present disclosure. In addition, among the constituent elements in the embodiments described below, the constituent element that does not appear in an independent claim, which has the broadest scope, is described as an optional constituent element. Furthermore, all the embodiments can be combined in any way. The signal processing method and the speaker system according to an aspect of the present disclosure are described below.

First Exemplary Embodiment

Configuration of Speaker System

FIG. 1 illustrates an example of the configuration of a speaker system 1 according to the present exemplary embodiment. As illustrated in FIG. 1, the speaker system 1 includes an input unit 11, a speaker 12, an amplifier 13, a processor 14, an input signal switching unit 15, and a measurement microphone 16. Note that the speaker 12, the amplifier 13, the input signal switching unit 15, and the measurement microphone 16 are not essential components.

The speaker system 1 may have a configuration including only the input unit 11 and the processor 14. The input unit 11 receives a signal to be played back by the speaker system 1 (e.g., a music signal). The term "speaker 12" correctively refers to a plurality of speakers each having a certain directivity.

Figure 2B:
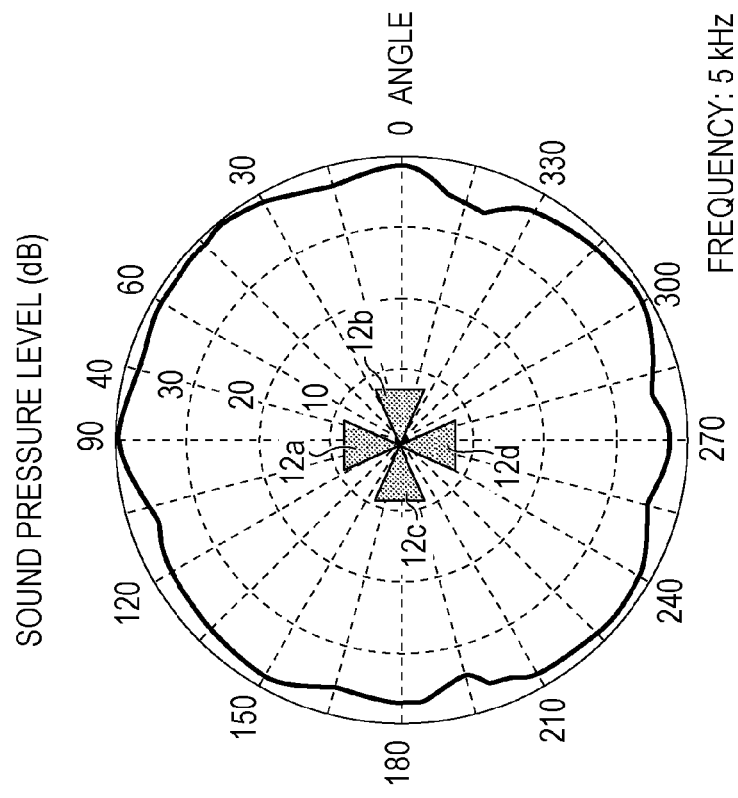
FIG. 2B illustrates the polar pattern obtained when four speakers according to the first exemplary embodiment output sound.
Figure 2A:
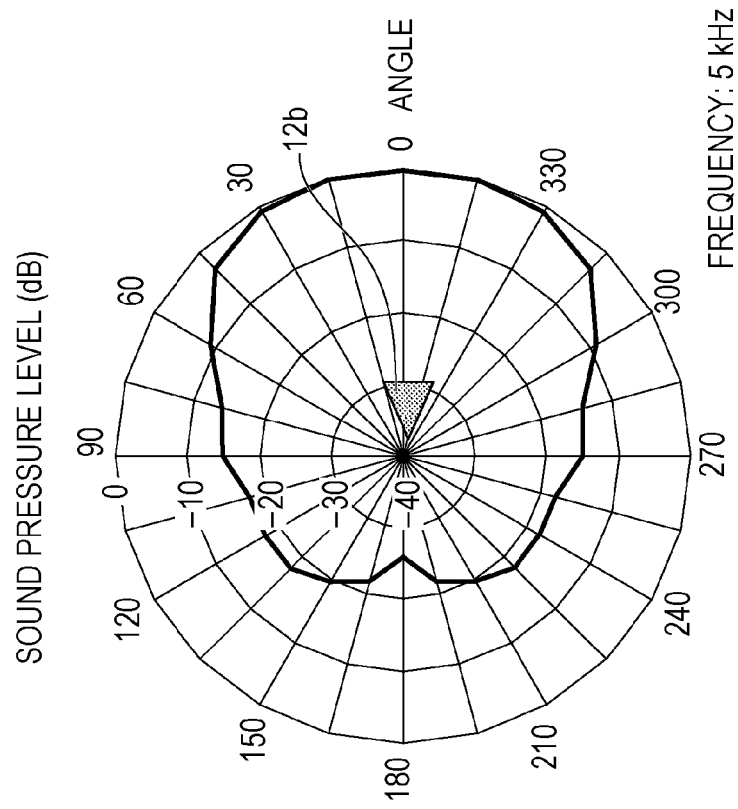
FIG. 2A illustrates the polar pattern of a speaker itself according to the first exemplary embodiment.

FIG. 2A illustrates the polar pattern of a single speaker according to the first exemplary embodiment. FIG. 2B illustrates the polar pattern obtained when four speakers 12a to 12d according to the first exemplary embodiment output sounds.

According to the present exemplary embodiment, the speaker 12 is formed from the speaker 12a, the speaker 12b, the speaker 12c, and the speaker 12d. The speaker 12a has, for example, a directivity of 90 degrees, as illustrated in FIG. 2A. Similarly, each of the speaker 12b, the speaker 12c, and the speaker 12d has a directivity of 90 degrees (not illustrated). In addition, the speaker 12 is disposed so that the orientations of the directivities of the speaker 12a, the speaker 12b, the speaker 12c, and the speaker 12d differ from one another. In this manner, the speaker 12 is omnidirectional, as illustrated in FIG. 2B. That is, if all the speakers 12a to 12d output sounds, the speaker 12 can play back sound at an equal sound pressure level in all directions (360 degrees).

Note that the speaker 12 is not limited to the above-described four speakers. The speaker 12 may be formed from two speakers each having a directivity of 90 degrees, and the two speakers may be placed in different directions so that the speaker 12 has a wide directivity of 180 degrees. Alternatively, the speaker 12 may be formed from three speakers each having a directivity of 90 degrees, and the three speakers may be placed in different directions so that the speaker 12 has a wide directivity of 270 degrees. That is, the speaker 12 may include any number of speakers if the speakers are placed in different orientations to provide a wide directivity of 180 degrees or more.

The term "amplifier 13" collectively refers to a plurality of amplifiers each corresponding to one of the plurality of speakers. According to the present exemplary embodiment, the amplifier 13 is formed from an amplifier 13a, an amplifier 13b, an amplifier 13c, and an amplifier 13d. The amplifier 13a is connected to the speaker 12a. The amplifier 13a amplifies a signal output from the processor 14 and transfers the signal to the speaker 12a. The amplifier 13b is connected to the speaker 12b. The amplifier 13b amplifies a signal output from the processor 14 and transfers the signal to the speaker 12b. The amplifier 13c is connected to the speaker 12c. The amplifier 13c amplifies a signal output from the processor 14 and transfers the signal to the speaker 12c. The amplifier 13d is connected to the speaker 12d. The amplifier 13d amplifies a signal output from the processor 14 and transfers the signal to the speaker 12d.

The measurement microphone 16 is disposed at the same location as the speaker 12. The measurement microphone 16 is used to measure the acoustic characteristics of the speaker 12. According to the present exemplary embodiment, the measurement microphone 16 is provided on the main body of the speaker 12. The measurement microphone 16 measures the sound played back by the speaker 12 and reflected off an object. In addition, the object is a sound-reflecting object, such as a wall.

The processor 14 is mounted in the speaker system 1 having a plurality of speakers each having a certain directivity. According to the present exemplary embodiment, as illustrated in FIG. 1, the processor 14 includes a control unit 141, a measurement signal generating unit 142, a reflected sound information acquiring unit 143, a coefficient calculation unit 144, and a correction unit 145.

The control unit 141 controls the input signal switching unit 15, the measurement signal generating unit 142, and the reflected sound information acquiring unit 143. The control unit 141 controls the input signal switching unit 15 to select between a signal output from the correction unit 145 (e.g., a music signal) and a signal output from the measurement signal generating unit 142 (e.g., a measurement signal), that is, between a music signal line and a measurement signal line, to feed to the amplifier 13. The control unit 141 controls the measurement signal generating unit 142 so as to generate a signal used to measure the reflected sound characteristics of the speaker 12. In addition, the control unit 141 controls the reflected sound information acquiring unit 143 so as to acquire reflected sound information measured by the measurement microphone 16.

The measurement signal generating unit 142 is controlled by the control unit 141. The measurement signal generating unit 142 generates a measurement signal used to measure the reflected sound characteristics of the speaker 12 and outputs the generated measurement signal to the input signal switching unit 15.

The reflected sound information acquiring unit 143 acquires, using the measurement microphone 16, the reflected sound information regarding the effect of the sound radiated from the speaker 12 and reflected off an object. More specifically, the reflected sound information acquiring unit 143 is controlled by the control unit 141 to acquire the reflected sound information measured by the measurement microphone 16. The reflected sound information includes primary reflected sound information regarding each of the plurality of speakers (the speakers 12a to 12d) that form the speaker 12.

The coefficient calculation unit 144 calculates a correction coefficient used to correct the acoustic characteristics of each of the plurality of speakers (the speakers 12a to 12d) that form the speaker 12 on the basis of the reflected sound information acquired by the reflected sound information acquiring unit 143. More specifically, the coefficient calculation unit 144 estimates the shape of a room surrounded by walls and containing the speakers (the speakers 12a to 12d) and the speaker locations at which the speakers are located in the shape of the room on the basis of the primary reflected sound information regarding the speakers (the speakers 12a to 12d) included in the reflected sound information acquired by the reflected sound information acquiring unit 143. Thereafter, the coefficient calculation unit 144 calculates the correction coefficients of the speakers (the speakers 12a to 12d) using the estimated shape of the room and speaker locations.

The correction unit 145 corrects the acoustic characteristics of each of the speakers (speakers 12a to 12d) that form the speaker 12 using the correction coefficient calculated by the coefficient calculation unit 144. Note that the acoustic characteristics of each of the speakers include at least one of the phase, the sound level, and the frequency characteristic of the speaker.

According to the present exemplary embodiment, the correction unit 145 includes an acoustic characteristic correction unit 145a, an acoustic characteristic correction unit 145b, an acoustic characteristic correction unit 145c, and an acoustic characteristic correction unit 145d. The acoustic characteristic correction unit 145a is connected to the amplifier 13a via the input signal switching unit 15. The acoustic characteristic correction unit 145a corrects a signal input to the input unit 11 and outputs the corrected signal to the amplifier 13a. The acoustic characteristic correction unit 145b is connected to the amplifier 13b via the input signal switching unit 15. The acoustic characteristic correction unit 145b corrects a signal input to the input unit 11 and outputs the corrected signal to the amplifier 13b. The acoustic characteristic correction unit 145c is connected to the amplifier 13c via the input signal switching unit 15. The acoustic characteristic correction unit 145c corrects a signal input to the input unit 11 and outputs the corrected signal to the amplifier 13c. The acoustic characteristic correction unit 145d is connected to the amplifier 13d via the input signal switching unit 15. The acoustic characteristic correction unit 145d corrects a signal input to the input unit 11 and outputs the corrected signal to the amplifier 13d.

The input signal switching unit 15 is controlled by the processor 14 and selects between the signal output from the correction unit 145 (e.g., a music signal) and the measurement signal output from the measurement signal generating unit 142 to feed to the amplifier 13. According to the present exemplary embodiment, upon selecting the measurement signal output from the measurement signal generating unit 142 to feed to the amplifier 13, the input signal switching unit 15 further feeds the measurement signal output from the measurement signal generating unit 142 to one of the amplifiers 13a to 13d.

Signal Processing Method for Use in Speaker System

Figure 3:
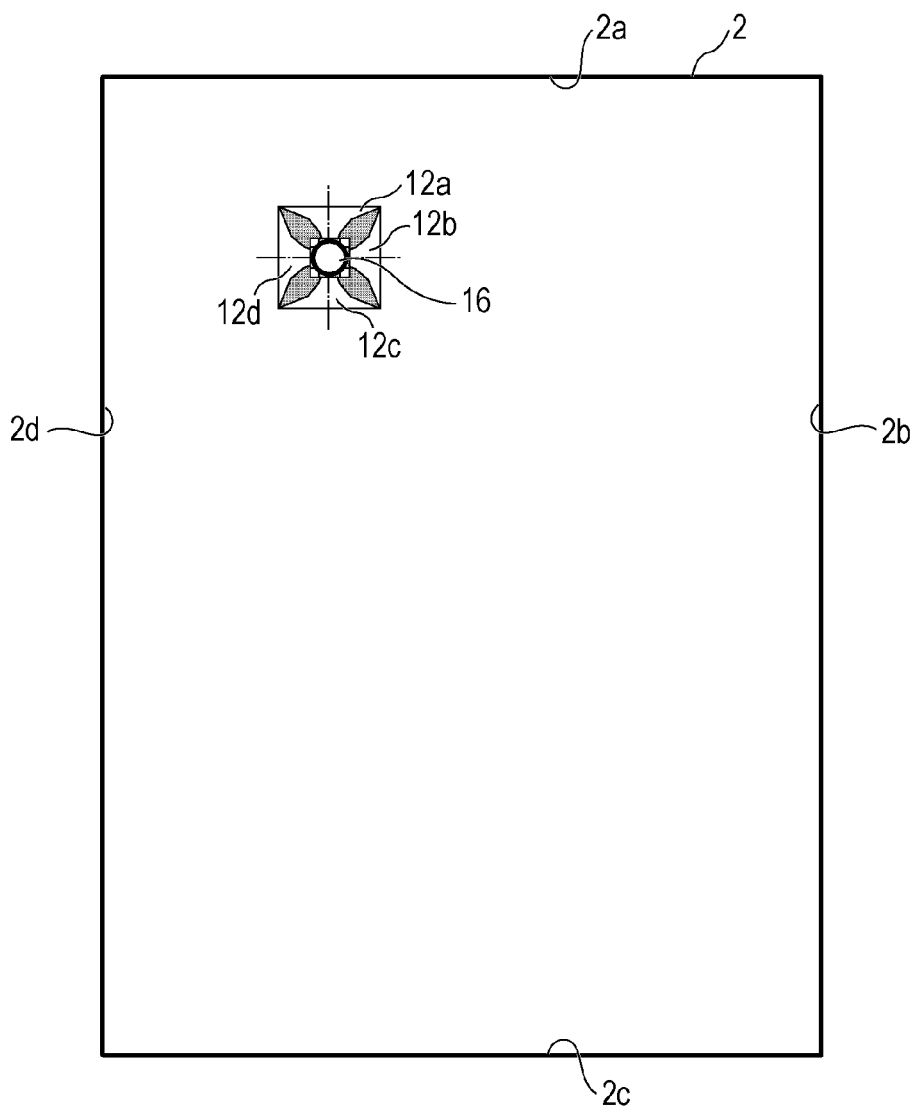
FIG. 3 illustrates an example of the positional relationship between a speaker and a wall according to the first exemplary embodiment.
Figure 4:
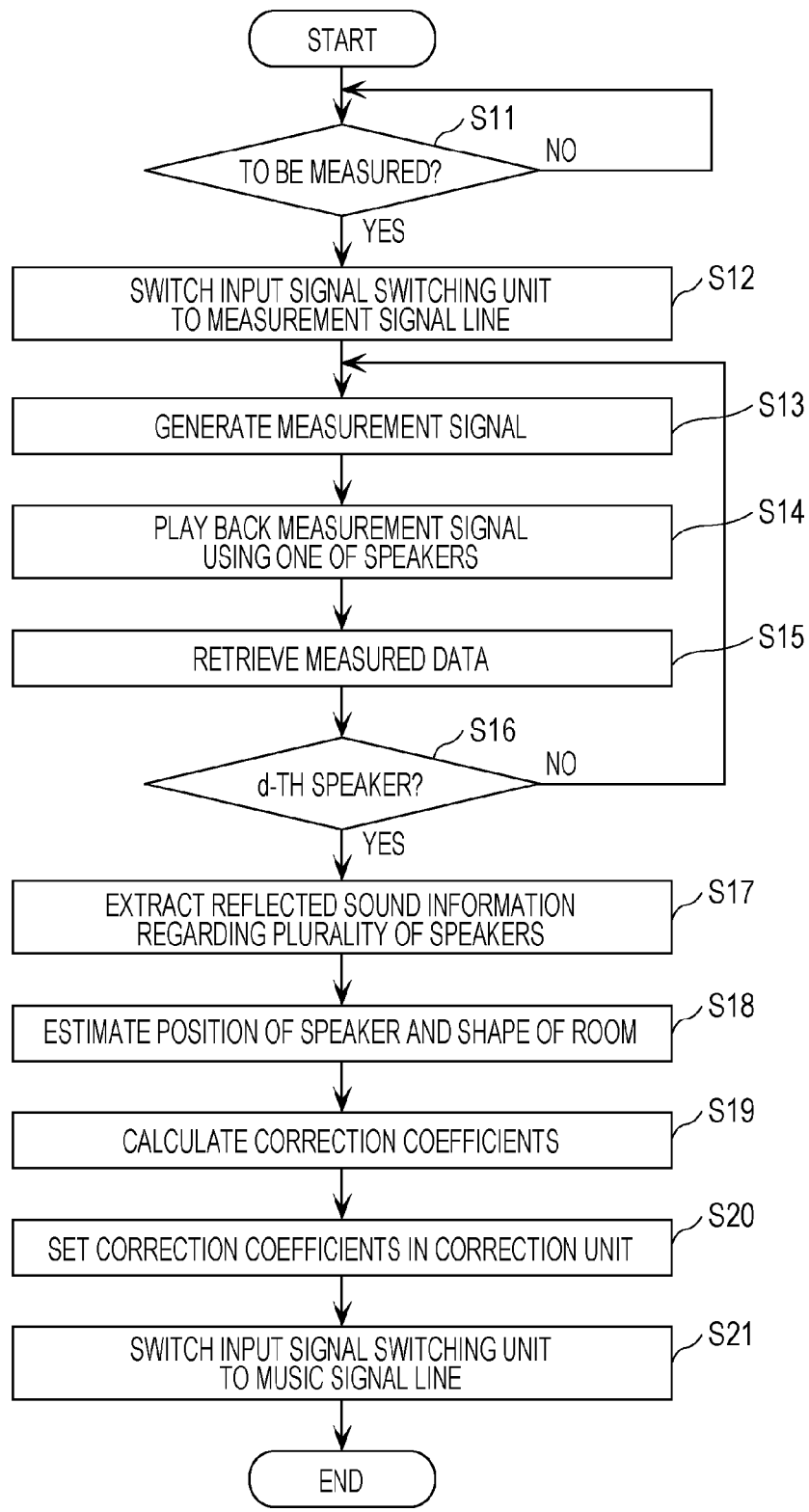
FIG. 4 is a flowchart of a signal processing method for use in the speaker system according to the first exemplary embodiment.

The signal processing method for use in the speaker system 1 having the above-described configuration is described in detail below with reference to the accompanying drawings. FIG. 3 illustrates an example of the positional relationship between the speaker 12 and walls according to the present exemplary embodiment. FIG. 4 is a flowchart of the signal processing method for use in the speaker system 1 according to the present exemplary embodiment.

As illustrated in FIG. 3, the speaker 12 is placed in the following manner. That is, the speaker 12a is placed at the position near a wall 2a of a room 2 so as to face the wall 2a. The speaker 12d is placed at the position near a wall 2d so as to face the wall 2d. The speaker 12b is placed at the position opposite to the speaker 12d (the position at which the speaker 12b faces a wall 2b). The speaker 12c is placed at the position opposite to the speaker 12a (the position at which the speaker 12c faces a wall 2c). The measurement microphone 16 is mounted on the body of the speaker 12. That is, the measurement microphone 16 is located at the same position as the speaker 12. The signal processing method for use in the speaker system 1 in such a case is described below with reference to FIG. 4.

As illustrated in FIG. 4, to measure the reflected sound characteristics of the speaker 12 (Yes in step S11), the processor 14 of the speaker system 1 controls the input signal switching unit 15 and switches the line to the measurement signal line first (step S12). More specifically, the processor 14 causes the input signal switching unit 15 to switch the signal input to the amplifier 13 from the signal of the correction unit 145 to the measurement signal of the measurement signal generating unit 142. Note that the reflected sound characteristics of the speaker 12 is measured at, for example, an initial setting time after the speaker 12 is set. However, the measured time is not limited thereto. The reflected sound characteristics may be measured at any time the listener of the playback sound (e.g., music) output from the speaker 12 wants to reduce the effect of the reflected sound on the acoustic characteristics.

Subsequently, the processor 14 causes the measurement signal generating unit 142 to generate a measurement signal used to measure the reflected sound characteristics (step S13) and causes one of the speakers (the speakers 12*a* to 12*d*) to play back the measurement signal (step S14). More specifically, the processor 14 causes the measurement signal generating unit 142 to generate the measurement signal and causes the input signal switching unit 15 to transfer the generated measurement signal to one of the amplifiers 13*a* to 13*d*. The transferred measurement signal is amplified by a corresponding one of the amplifiers 13*a* to 13*d* and is played back by a corresponding one of the speakers 12*a* to 12*d*. Note that the one of the amplifiers 13*a* to 13*d* is sequentially selected in alphabetical order of the suffixes a to d.

Subsequently, the processor 14 causes the reflected sound information acquiring unit 143 to retrieve measured data (step S15). More specifically, the signal played back by one of the speakers 12*a* to 12*d* is measured by the measurement microphone 16 mounted on the body of the speaker 12 and is retrieved by the reflected sound information acquiring unit 143 as measured data.

Subsequently, the processor 14 determines whether the measured data retrieved by the reflected sound information acquiring unit 143 is the data of the d-th speaker (the speaker 12*d*) of the speakers 12*a* to 12*d* (step S16). If the measured data is not the data of the d-th speaker (No in step S16), the processing returns to step S13 and continues to measure the data. However, if the measured data is the data of the d-th speaker (Yes in step S16), the processing proceeds to the next step S17.

Subsequently, the processor 14 causes the reflected sound information acquiring unit 143 to extract the reflected sound information regarding the plurality of speakers (the speakers 12*a* to 12*d*) from the acquired measured data (step S17) and causes the coefficient calculation unit 144 to estimate the position of the speaker 12 and the shape of the room 2 (step S18).

Figure 5C:
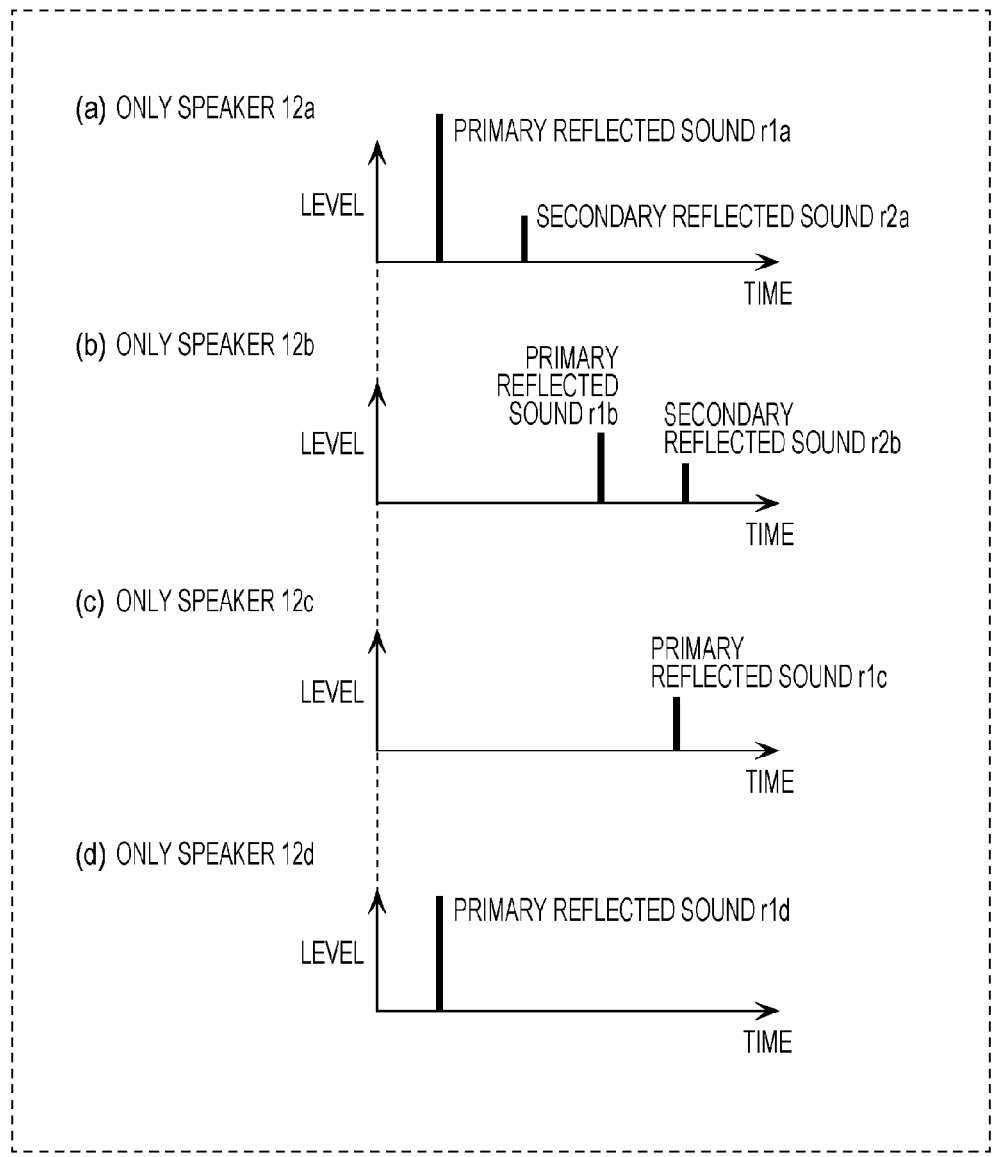
FIG. 5C illustrates the method for estimating the position of a speaker and the shape of a room according to the first exemplary embodiment.
Figure 6:
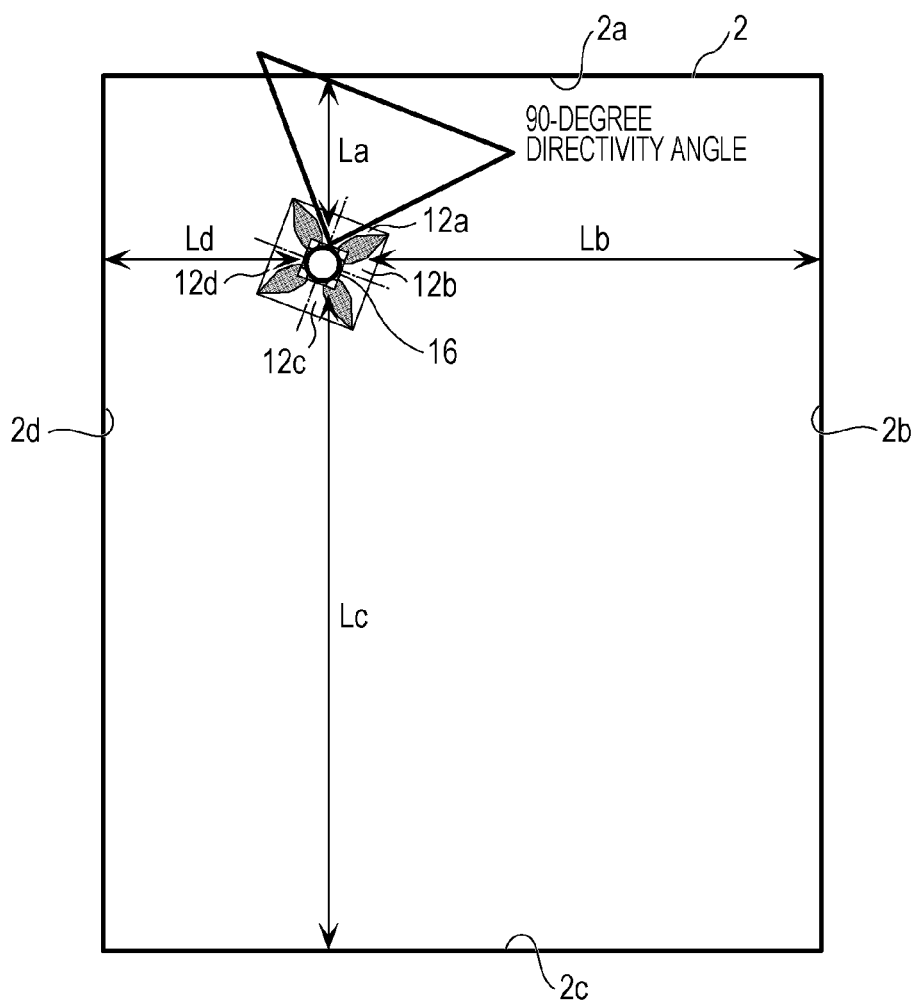
FIG. 6 illustrates an estimation method employed when the speaker is set so as not to be parallel to a wall.

A method for estimating the position of the speaker 12 and the shape of the room 2 is described in detail below. FIGS. 5A to 5C illustrate the method for estimating the position of the speaker 12 and the shape of the room 2 according to the present exemplary embodiment. FIG. 6 illustrates the estimation method employed when the speaker 12 is set so as not to be parallel to the walls 2*a* to 2*d*. The same reference numerals are used to describe the elements that are identical to the elements of FIG. 3, and detailed description of the elements is not repeated.

FIG. 5A illustrates a path of primary reflected sound r1*a* and secondary reflected sound r2*a* played back by the speaker 12*a* from the speaker 12*a* to the measurement microphone 16 and distances La, Lb, Lc, and Ld between the walls 2*a*, 2*b*, 2*c*, and 2*d* and the measurement microphone 16. FIG. 5B illustrates an example of the reflected sound information in the form of a time response waveform extracted from the measured data of the measurement signal played back by the speaker 12*a*. FIG. 5C illustrates an example of the reflected sound information in the form of a time response waveform extracted from the measured data of the measurement signal played back by each of the speakers 12*a* to 12*d*.

As illustrated in FIG. 5A, since the wall 2*a* is present in front of the speaker 12*a*, the measurement signal played back by the speaker 12*a* is reflected off the wall 2*a* and reaches the measurement microphone 16. The magnitude of the reflected sound output from the speaker 12*a* and received by the measurement microphone 16 is represented by a time response waveform attenuated in accordance with the distance between the speaker 12*a* and the wall 2*a*, the distance between the wall 2*a* and the measurement microphone 16, and the reflection coefficient of the wall 2*a*. As can be seen from the polar pattern of the speaker 12*a* illustrated in FIG. 2A, the speaker 12*a* has a directivity of 90 degrees. Accordingly, the sound pressure level rapidly decreases at a position which is 45 or more degrees off the forward axis of the speaker 12*a* on either side. Thus, the distances between the walls 2*a*, 2*b*, 2*c*, and 2*d* and the position of the speaker 12*a* can be determined using the reflected sound (the primary reflected sound) of a dominant sound pressure level at a position within about 90 degrees. The processor 14 can estimate the distances between the walls 2*a*, 2*b*, 2*c*, and 2*d* and the position of the speaker 12*a* using the time response waveform illustrated in FIG. 5B.

More specifically, as illustrated in FIGS. 5A and 5B, the distance La between the speaker 12*a* and the wall 2*a* can be represented as $(c \times r1a \times t)/2$, where c denotes the sound speed (m/sec). That is, the distance between the position of the speaker 12*a* and the wall 2*a* can be estimated using the primary reflected sound of the speaker 12*a*.

Thereafter, a similar process is repeated by using each of the measurement signals played back by the speakers 12*b* to 12*d*. In this manner, the distances Lb to Ld can be estimated from the time response waveforms illustrated in FIG. 5C.

Thereafter, by summing the distance Lb and the distance Ld, the breadth of the room 2 can be estimated. By summing the distance La and the distance Lc, the length of the room 2 can be estimated. In this manner, the shape of the room 2 can be estimated. In addition, the position of the speaker 12 can be estimated as the position at the distance La from the wall 2*a*, the distance Lb from the wall 2*b*, the distance Lc from the wall 2*c*, and the distance Ld from the wall 2*d*.

Note that in FIGS. 5A to 5C, the estimation method is illustrated on the assumption that the speaker 12 is placed parallel to the walls. However, the placement of the speaker 12 is not limited thereto. The same estimation method can be employed even when as illustrated in FIG. 6, the speaker 12 is not placed parallel to the walls. Even when the speaker 12 is not placed parallel to the walls 2*a* to 2*d*, the shape of the room 2 can be estimated using a method similar to the method illustrated in FIGS. 5A to 5C and the reflected sounds that are reflected off the walls 2*a* to 2*d* and take the shortest ways (the primary reflected sounds), since each of the speakers 12*a* to 12*d* has a directivity angle of 90 degrees. Referring back to FIG. 4, the signal processing method for use in the speaker system 1 is described below.

Subsequently, the processor 14 causes the coefficient calculation unit 144 to calculate the correction coefficients (step S19) and causes the correction unit 145 to set up the correction coefficients (step S20). Thereafter, the processor 14 causes the input signal switching unit 15 to switch the signal input to the amplifier 13 to the music signal line (step S21).

More specifically, the processor 14 causes the coefficient calculation unit 144 to calculate the correction coefficient for each of the speakers 12*a* to 12*d* that form the speaker 12 on the basis of the estimated shape of the room 2 and the position of the speaker 12 and sets up the calculated correction coefficients in the acoustic characteristic correction units 145*a* to 145*d*. Thereafter, the processor 14 controls the input signal switching unit 15 to switch the input signal line to the signal line through which the correction unit 145 outputs signals (i.e., the music signal line).

Figure 7:
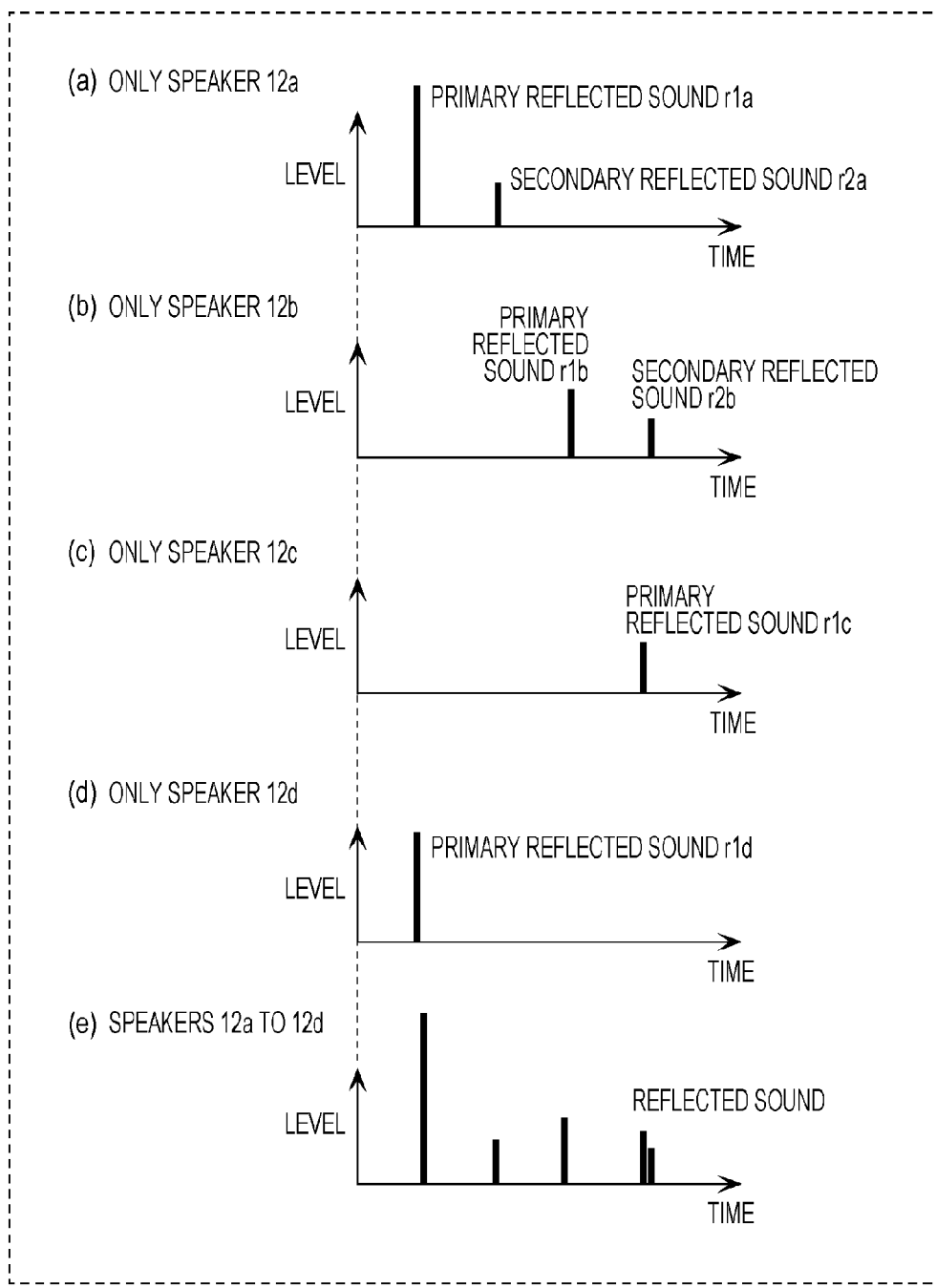
FIG. 7 illustrates the time response at the position of a measurement microphone before correction according to the first exemplary embodiment.
Figure 9:
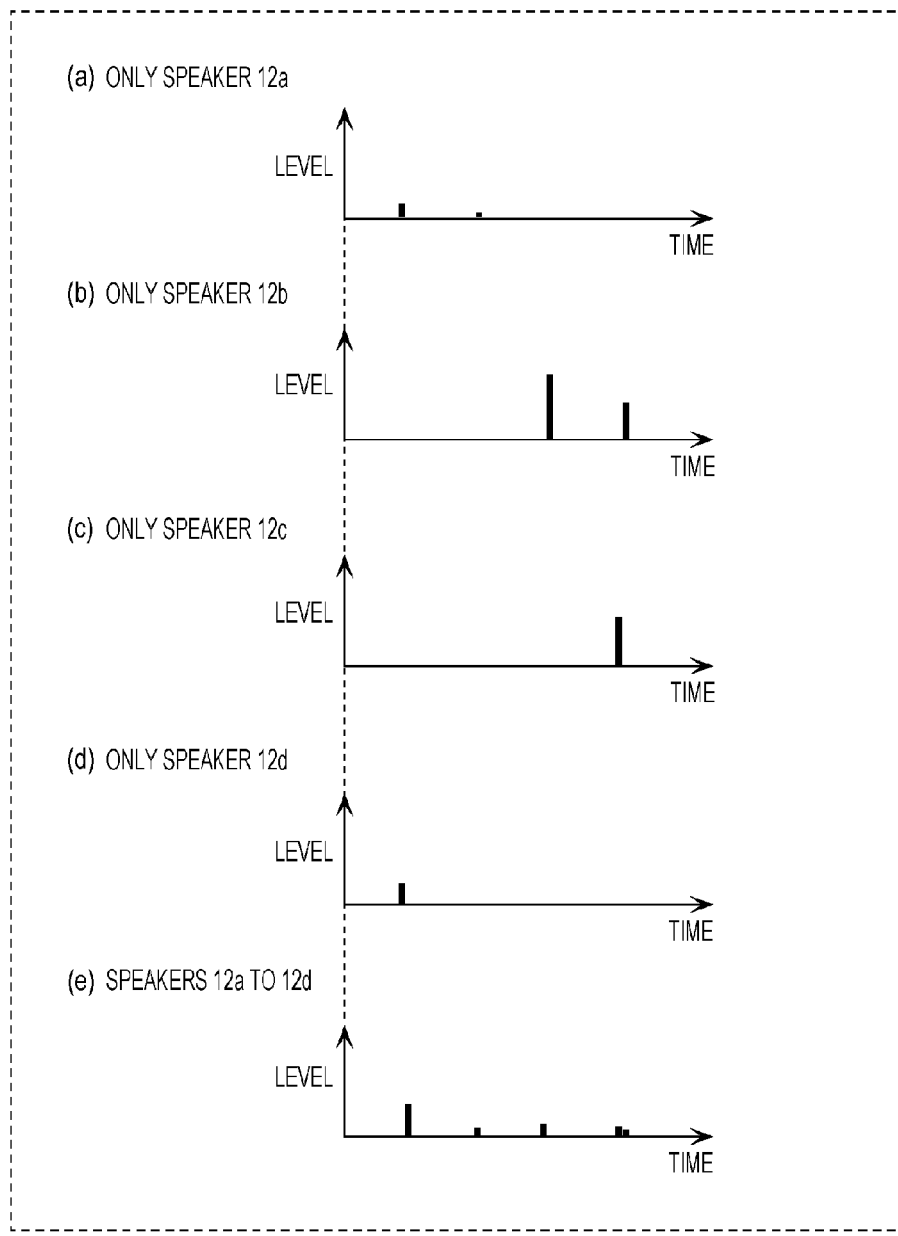
FIG. 9 illustrates the time response at the position of the measurement microphone after correction according to the first exemplary embodiment.

A technique for calculating the correction coefficients is described in detail below. FIG. 7 illustrates the time responses at the position of the measurement microphone 16 before correction according to the first exemplary embodiment. Note that Cases (a) to (d) in FIG. 7 are the same as Cases (a) to (d) in FIG. 5C, and descriptions thereof are not repeated. FIG. 8 illustrates an example of the correction coefficients according to the first exemplary embodiment. FIG. 9 illustrates the time responses at the position of the measurement microphone 16 after correction according to the first exemplary embodiment.

The coefficient calculation unit 144 estimates the time response at the position of the measurement microphone 16 in Case (e) illustrated in FIG. 7 before correction using the reflected sound information regarding each of the speakers 12a to 12d illustrated in FIG. 5C (the reflected sound information extracted by the reflected sound information acquiring unit 143). In Cases (a) and (d) illustrated in FIG. 7, the level of the primary reflected sound is high. That is, the reflected sound off the wall 2a and the reflected sound off the wall 2d have a significant impact on the speaker 12a and the speaker 12d, respectively. Accordingly, as illustrated in FIG. 8, to reduce the impact, the coefficient calculation unit 144 reduces, for example, the correction coefficient for the speaker 12a to 0.1 times the normal correction coefficient value, reduces the correction coefficient for the speaker 12d to 0.2 times the normal correction coefficient value, and maintains the correction coefficients for the speakers 12b and 12c at the original correction coefficient values (even). In this manner, the coefficient calculation unit 144 calculates the correction coefficients so as to reduce the input levels of the speaker 12a and the speaker 12d in order to reduce the impact of the reflected sound and maintain the input levels of the other speakers 12b and 12c unchanged.

Subsequently, the correction coefficients are set up in the acoustic characteristic correction units 145a to 145d. In this manner, the time responses illustrated in FIG. 9 can be obtained at the position of the measurement microphone 16. As a result, the impact of the reflected sound can be reduced. That is, as indicated by the time response in Case (e) illustrated in FIG. 9, the reflected sound is reduced at the position of the measurement microphone 16. Accordingly, the impact of the reflected sound off the walls 2a to 2d is negligible and, thus, the direct sound from the speaker 12 is dominant. Consequently, the listener can hear the sound with excellent acoustic characteristics. In this manner, the speaker 12 can reduce the effect of the reflected sound while maintaining wide directivity and, thus, the excellent acoustic characteristics can be obtained.

Note that the technique for calculating the correction coefficient is not limited to a technique for calculating the correction coefficients of the input levels. For example, the correction coefficients of the frequency characteristics may be calculated. A technique for calculating the correction coefficients of the frequency characteristics is described below.

Figure 10:
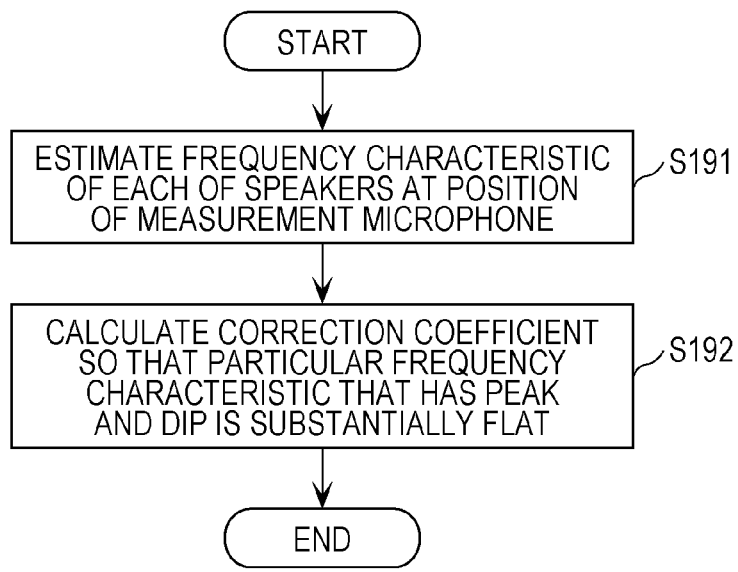
FIG. 10 is an example of a detailed flowchart of a process performed in step S19 illustrated in FIG. 4.
Figure 11A:
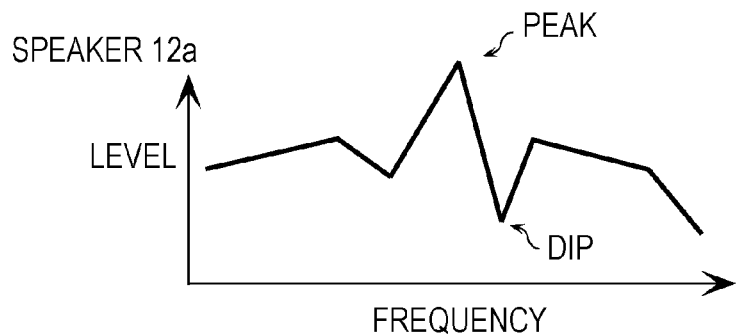
FIG. 11A illustrates a technique for calculating the correction coefficient for the frequency characteristics.
Figure 11B:
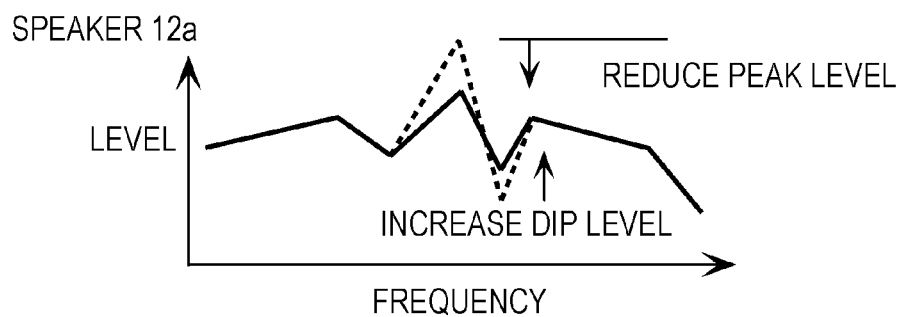
FIG. 11B illustrates the technique for calculating the correction coefficient of the frequency characteristics.

FIG. 10 is an example of a detailed flowchart of a process performed in step S19 illustrated in FIG. 4. FIGS. 11A and 11B illustrate the technique for calculating the correction coefficient of the frequency characteristics.

In step S19, the coefficient calculation unit 144 estimates the frequency characteristic of each of the speakers at the position of the measurement microphone 16 first (step S191). More specifically, the coefficient calculation unit 144 estimates, for example, the frequency characteristic illustrated in FIG. 11A using the reflected sound information regarding the speaker 12a illustrated in FIG. 5C (the reflected sound information extracted by the reflected sound information acquiring unit 143). According to the present exemplary embodiment, as described above, it is estimated that a large dip is generated in a certain period frequency because of the effect of the measurement sound played back by the speaker 12a and reflected off the wall 2a.

Subsequently, the coefficient calculation unit 144 calculates the correction coefficient so that the frequency characteristic of a particular frequency that causes a peak or a dip is substantially flat (step S192). More specifically, for example, in the frequency characteristic illustrated in FIG. 11A, the coefficient calculation unit 144 calculates the correction coefficient of the frequency characteristic so that the peak level decreases and the dip level increases, as illustrated in FIG. 11B.

Advantages

As described above, according to the present exemplary embodiment, the signal processing method and the speaker system 1 can reduce the effect of the reflected sound on the acoustic characteristics. More specifically, according to the signal processing method and the speaker system 1 according to the present exemplary embodiment, by employing, for example, a method for increasing the correction coefficient of the acoustic characteristics of a speaker radiating the reflected sound that dominantly reaches the listener among a plurality of speakers (the speakers 12a to 12d) forming the speaker 12, the effect of the reflected sound on the acoustic characteristics can be reduced. In this manner, the signal processing method and the speaker system 1 of the present exemplary embodiment can reduce the effect of the sound reflected off a sound-reflecting object, such as a wall, while maintaining the wide directivity, so that the direct sound can dominantly reach the listener. As a result, the listener can hear the sound with excellent acoustic characteristics.

Modifications

While the first exemplary embodiment has been described with reference to, for example, the signal processing method capable of reducing the effect of the sound reflected off a sound-reflecting object, such as a wall, so that the direct sound dominantly reaches the listener, the signal processing method is not limited thereto. The effect of the sound reflected off a sound-reflecting object, such as a wall, may be reduced by allowing the reflected sound to reach the listener in the form of reverb. The method is described below. Note that the differences from the first exemplary embodiment are mainly described.

Configuration of Speaker System

Figure 12:
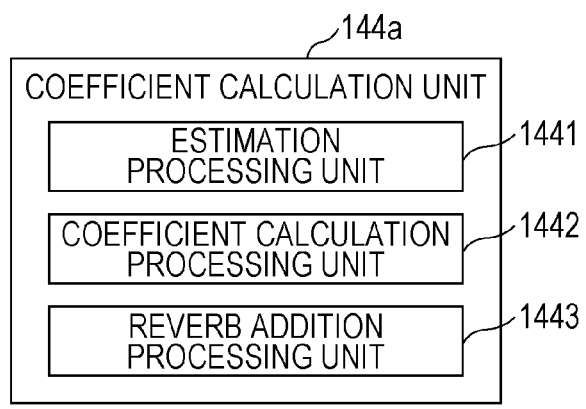
FIG. 12 illustrates an example of the functional structure of a coefficient calculation unit according to a modification of the first exemplary embodiment.

A speaker system 1 according to a modification of the present exemplary embodiment includes a coefficient calculation unit 144a having a configuration that differs from that of the speaker system 1 according to the first exemplary embodiment. FIG. 12 illustrates an example of the functional structure of the coefficient calculation unit 144a according to the modification of the present exemplary embodiment. The coefficient calculation unit 144a calculates a correction coefficient used to correct the acoustic characteristics of each of the plurality of speakers (the speakers 12a to 12d) that form the speaker 12 on the basis of the reflected sound information acquired by the reflected sound information acquiring unit 143. As illustrated in FIG. 12, the coefficient calculation unit 144a includes an estimation processing unit 1441, a coefficient calculation processing unit 1442, and a reverb addition processing unit 1443.

The estimation processing unit 1441 estimates the shape of a room 2 surrounded by walls and containing a plurality of speakers and the speaker locations at which the speakers are located in the shape of the room on the basis of the primary reflected sound information regarding the speakers included in the reflected sound information acquired by the reflected sound information acquiring unit 143. The estimation processing unit 1441 further estimates the listening position in the shape of the room on the basis of the estimated shape of the room and the estimated positions of the speakers and, thereafter, estimates the response time of the sound played back by each of the speakers (the speakers 12a to 12d) that form the speaker 12 at the listening position. The coefficient calculation processing unit 1442 calculates the correction coefficient of each of the speakers using the estimated shape of the room and speaker positions.

The reverb addition processing unit 1443 adds the reverb to the sound played back by the plurality of speakers (the speakers 12a to 12d) at the listening position by controlling the delay time and the sound level of a speaker facing the wall of the room 2 among the plurality of speakers (the speakers 12a to 12d) forming the speaker 12 on the basis of the shape of the room and the speaker positions estimated by the estimation processing unit 1441 and the response time at the listening position. According to the present exemplary embodiment, the reverb addition processing unit 1443 controls the delay time and the sound level of the speaker facing the wall of the room 2 among the plurality of speakers (the speakers 12a to 12d) forming the speaker 12 by controlling the acoustic characteristic correction unit 145a, the acoustic characteristic correction unit 145b, the acoustic characteristic correction unit 145c, and the acoustic characteristic correction unit 145d. Note that both the reverb addition process and the process that calculates the correction coefficient and applies the calculated correction coefficient to the correction unit 145 need not be performed. Only the reverb addition process may be performed.

Signal Processing Method According to Modification

Figure 13:
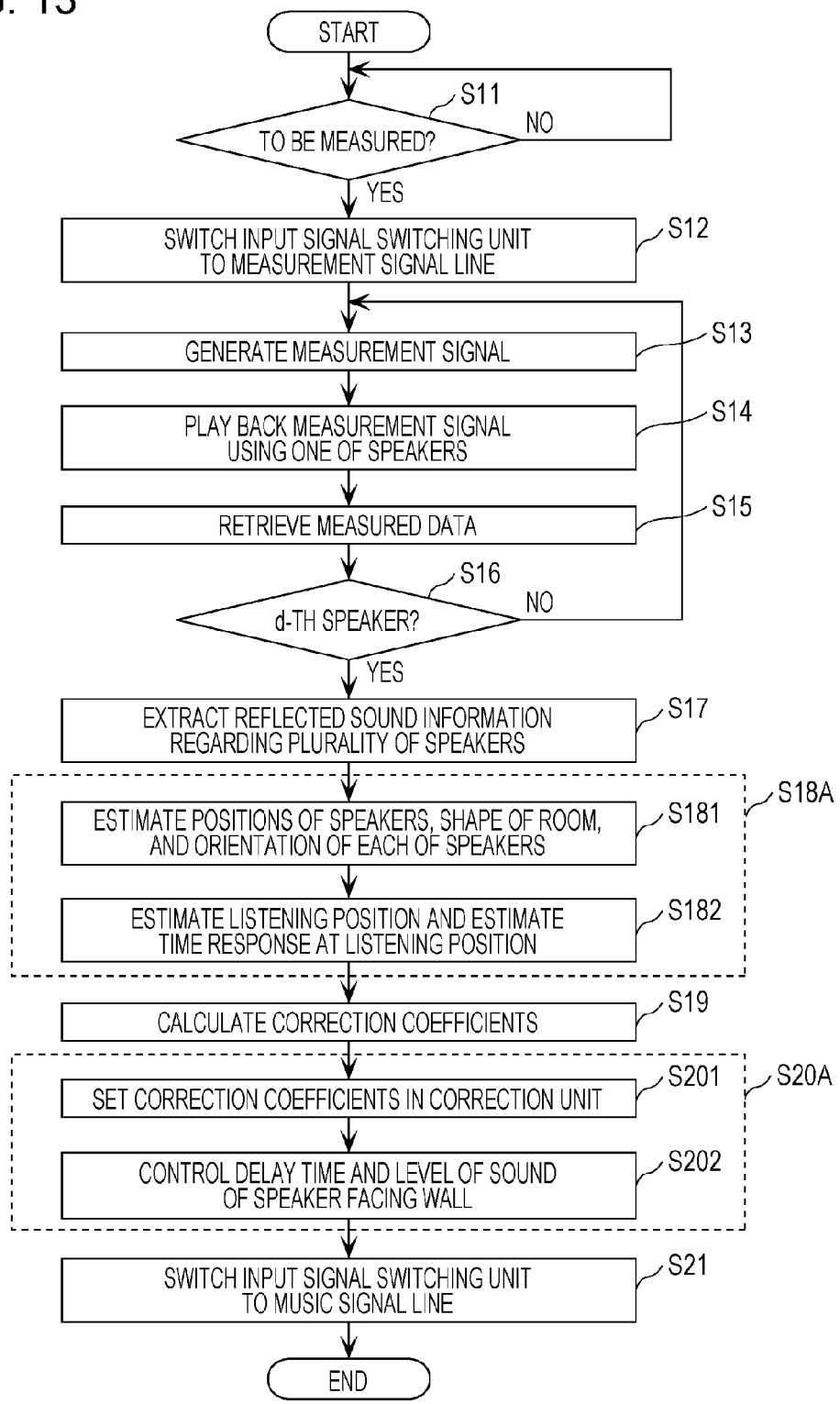
FIG. 13 is a flowchart of a signal processing method for use in a speaker system according to the modification of the first exemplary embodiment.

The signal processing method for use in the speaker system 1 having the above-described configuration of the modification is described below. FIG. 13 is a flowchart of the signal processing method for use in the speaker system 1 according to the modification of the present exemplary embodiment. Note that the same reference numerals are used to describe the elements that are identical to the elements of FIG. 4, and detailed description of the elements is not repeated.

In step S18A, the processor 14 causes the coefficient calculation unit 144 to estimate the position of the speaker 12 and the shape of the room 2 first (step S181). Subsequently, the processor 14 causes the coefficient calculation unit 144 to estimate the listening position in the shape of the room 2 on the basis of the estimated shape of the room 2 and position of the speaker 12 and estimate the response time of the sound played back by each of the speakers (speakers 12a to 12d) forming the speaker 12 at the listening position (step S182).

In addition, in step S20A, the processor 14 causes the coefficient calculation unit 144 to set the correction coefficients calculated in step S19 in the correction unit 145 (step S201). Thereafter, the processor 14 causes the coefficient calculation unit 144 to control the delay time and the level of the sound of the speaker facing the wall (step S202).

Figure 14:
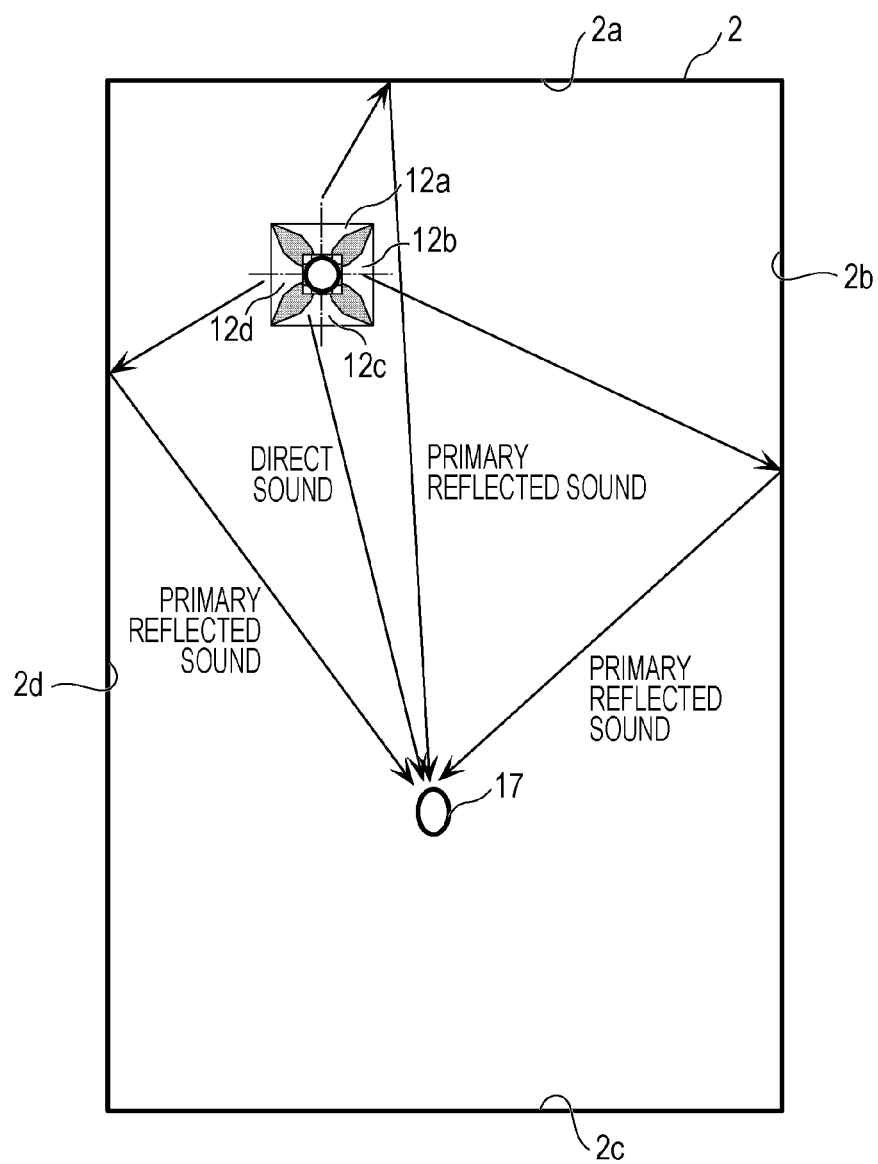
FIG. 14 illustrates a reverb addition processing method according to a modification of the first exemplary embodiment.
Figure 15A:
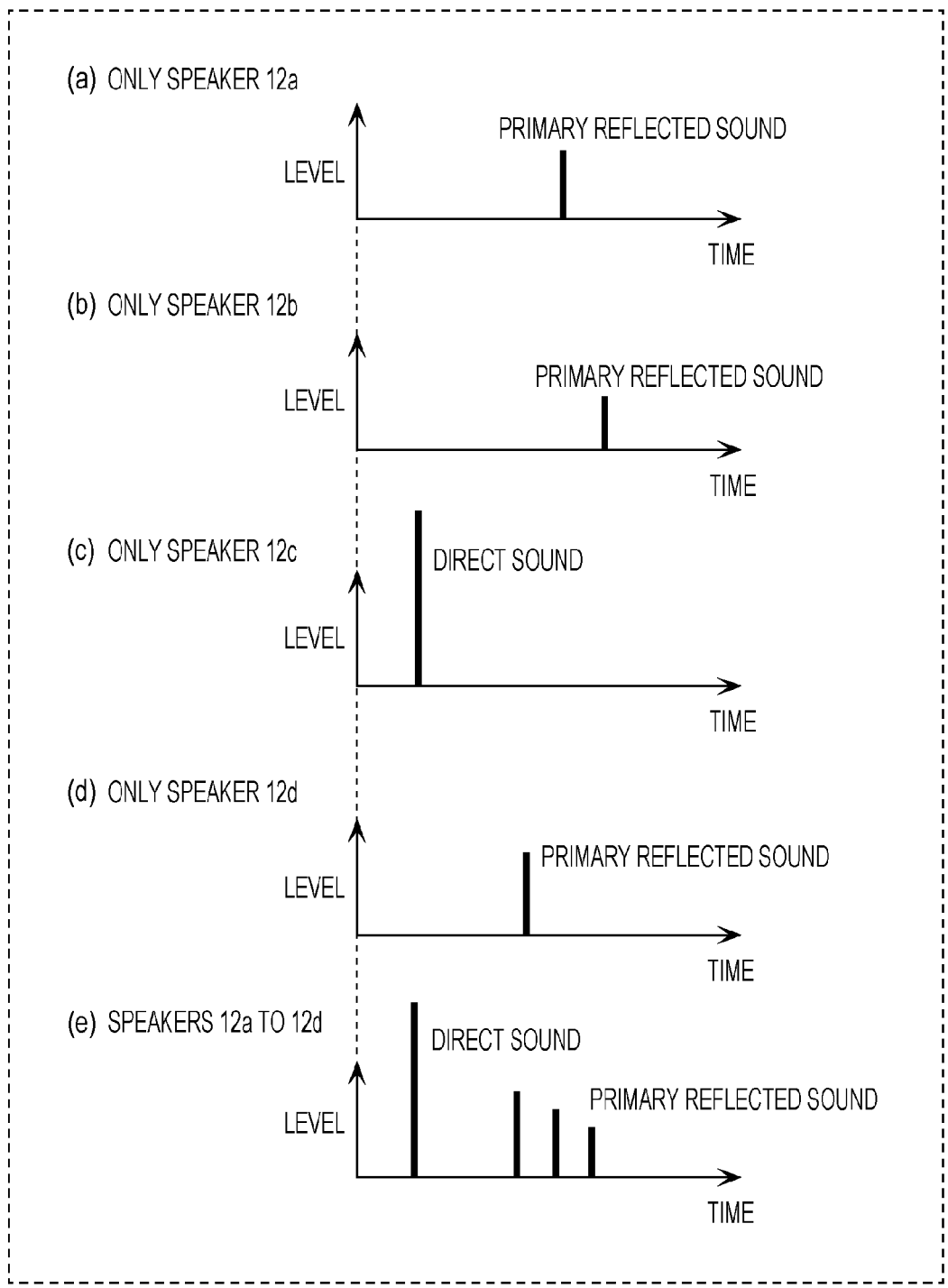
FIG. 15A illustrates the reverb addition processing method according to the modification of the first exemplary embodiment.
Figure 15B:
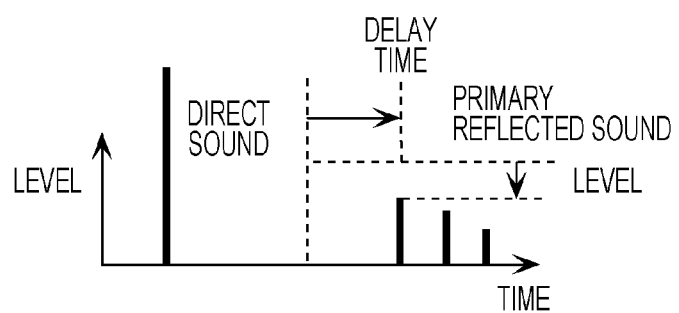
FIG. 15B illustrates the reverb addition processing method according to the modification of the first exemplary embodiment.

The reverb addition processing method is described in detail below. FIGS. 14 to 15B illustrate the reverb addition processing method according to the modification of the present exemplary embodiment. In FIG. 14, an example of the relationship among the position of the speaker 12, the shape of the room 2, and a listening position 17 is illustrated. In FIG. 15A, an example of the time response waveform of the sound measured at the listening position 17 illustrated in FIG. 14 is illustrated. In FIG. 15B, an example of the time response waveform of the sound measured at the listening position 17 after the reverb addition process is performed is illustrated.

For example, as illustrated in FIG. 14, the primary reflected sound from the speaker 12a that faces the wall 2a, the primary reflected sound from the speaker 12b that faces the wall 2b, the primary reflected sound from the speaker 12d that faces the wall 2d, and direct sound from the speaker 12c reach the listening position 17. In such a case, for example, as indicated by Cases (a) to (d) illustrated in FIG. 15A, the listener hears the sounds having the time response waveforms from the speakers 12a to 12d at the listening position 17. That is, as indicated by Case (e) illustrated in FIG. 15A, the listener hears the sound having the time response waveform from the speaker 12.

Thus, for example, as illustrated in FIG. 15B, the sounds from the speakers 12a, 12b, and 12d that face the walls 2a, 2b, and 2d, respectively, are delayed. In addition, the input levels are reduced to appropriate levels. In this manner, rich sound having the reverb added thereto can be generated.

That is, in the example illustrated in FIG. 14 and FIG. 15A, it can be estimated that the direct sound that reaches the listening position 17 is coming from only the speaker 12c. Accordingly, control is performed so that the sounds from the speakers 12a, 12b, and 12d are delayed and the input levels are decreased from the primary reflected sounds from the speakers 12a, 12b, and 12d. If the primary reflected sound is desired to be emphasized, control is performed so that the primary reflected sound is increased. In this manner, the reverb is added to the sound output from the speaker 12 and, thus, sound field reproduction is improved. Note that the time by which the sound is delayed (the delay time) needs to be changed in accordance with the dimensions of the room 2. For example, for the room 2 with dimensions of 5 m×5 m, a delay time of 50 ms to 100 ms can be employed. The delay time increases with increasing dimensions of the room 2.

Advantages

As described above, according to the modification of the present exemplary embodiment, rich reverb sound, for example, can be additionally provided at the listening position by independently delaying the sound of each of speakers facing a wall among a plurality of speakers forming the speaker 12 and decreasing the input level of the sound using the positions and orientations of the speakers estimated using the measurement microphone 16 placed at the position of the speaker 12. In this manner, according to the signal processing method and the speaker system of the modification of the present exemplary embodiment, the effect of the reflected sound on the acoustic characteristics can be reduced.

Second Exemplary Embodiment

In the first exemplary embodiment, an example in which the speaker 12 plays back the entire frequency range of a music signal input to the input unit 11 and output from the processor 14 has been described. According to the present exemplary embodiment, the case in which the speaker 12 plays back only a high range of the entire frequency range (a high frequency range) of a music signal output from the processor 14 is described.

Configuration of Speaker System

FIG. 16 illustrates an example of the configuration of a speaker system 1B according to the second exemplary embodiment. The same reference numerals are used to describe the elements that are identical to the elements of FIG. 1, and detailed description of the elements is not repeated. Unlike the speaker system 1 according to the first exemplary embodiment illustrated in FIG. 1, the speaker system 1B according to the present exemplary embodiment includes a processor 14A having a band dividing unit 146. In addition, the speaker system 1B includes a woofer 22 and an amplifier 23. The difference from the first exemplary embodiment is mainly described below.

The woofer 22 is a speaker that handles only bass sound (e.g., a woofer). The woofer 22 differs from the speaker 12. The amplifier 23 is connected to the woofer 22. The amplifier 23 amplifies a signal output from the processor 14A and delivers the amplified signal to the woofer 22.

The band dividing unit 146 divides the frequency range of the signal input to be played back by the speaker 12 and the woofer 22 into at least a low frequency band and a high frequency band. The band dividing unit 146 outputs the divided signal in the high frequency band to the speaker 12 and outputs the divided signal in the low frequency band to the woofer 22.

Signal Processing Method for Use in Speaker System

The signal processing method for use in the speaker system 1B having the above-described configuration is described below. When a music signal, for example, is input to the input unit 11, the band dividing unit 146 divides the input music signal into a signal in the high frequency band and a signal in the low frequency band. At that time, for example, the band dividing unit 146 may divide the input music signal into a signal in the high frequency band and a signal in the low frequency band at about 3 kHz.

In this manner, the music signal in the high frequency band passes through the correction unit 145 and the amplifier 13 and is played back by the speaker 12. The music signal in the low frequency band passes through the amplifier 23 and is played back by the woofer 22.

Advantages

As described above, according to the present exemplary embodiment, the signal processing method and the speaker system 1B capable of reducing the effect of the reflected sound on the acoustic characteristics can be provided. More specifically, the signal processing method and the speaker system 1B according to the present exemplary embodiment can reduce the effect of the sound reflected off a sound-reflecting object, such as a wall, while maintaining the wide directivity so that direct sound in the high frequency band dominantly reaches the listener. Accordingly, the listener can hear the sound with excellent acoustic characteristics.

Modifications

Note that a low frequency characteristic correction unit may be provided between the amplifier 23 and the band dividing unit 146. This is because when a music signal in the low frequency band is played back by the woofer 22, the frequency characteristic at about f0 of the woofer 22 may vary in accordance with the position of the speaker 12 (e.g., a position near a window or at the center of the room 2) and, thus, the balance between low frequency and high frequency components may change. For example, when the speaker 12 is set near a wall of the room 2, the frequency in the vicinity of f0 of the woofer 22 increases.

In such a case, the coefficient calculation unit 144 may further calculate a correction coefficient used to correct the acoustic characteristics of the woofer 22 on the basis of the reflected sound information acquired by the reflected sound information acquiring unit 143. Thereafter, the coefficient calculation unit 144 may set the calculated correction coefficient in the low frequency characteristic correction unit.

As described above, according to the present exemplary embodiment, even when the speaker system further includes the woofer 22 and has a 2-way speaker configuration (a speaker for high frequencies and a speaker for low frequencies), the balance between low frequency and high frequency components can be maintained wherever the speaker 12 is set in the room. In this manner, the listener can hear the sound with a reduced disturbance of the frequency characteristic within a wide listening area.

Third Exemplary Embodiment

While the first and second exemplary embodiments have been described with reference to the configuration in which the speaker system estimates the position of the speaker 12 and the shape of the room 2 using the measurement microphone, the configuration is not limited thereto. The user (a listener) of the speaker system may input the position of the speaker 12 and the shape of the room 2 to the speaker system. Such a case is described below.

Configuration of Speaker System

Figure 17:
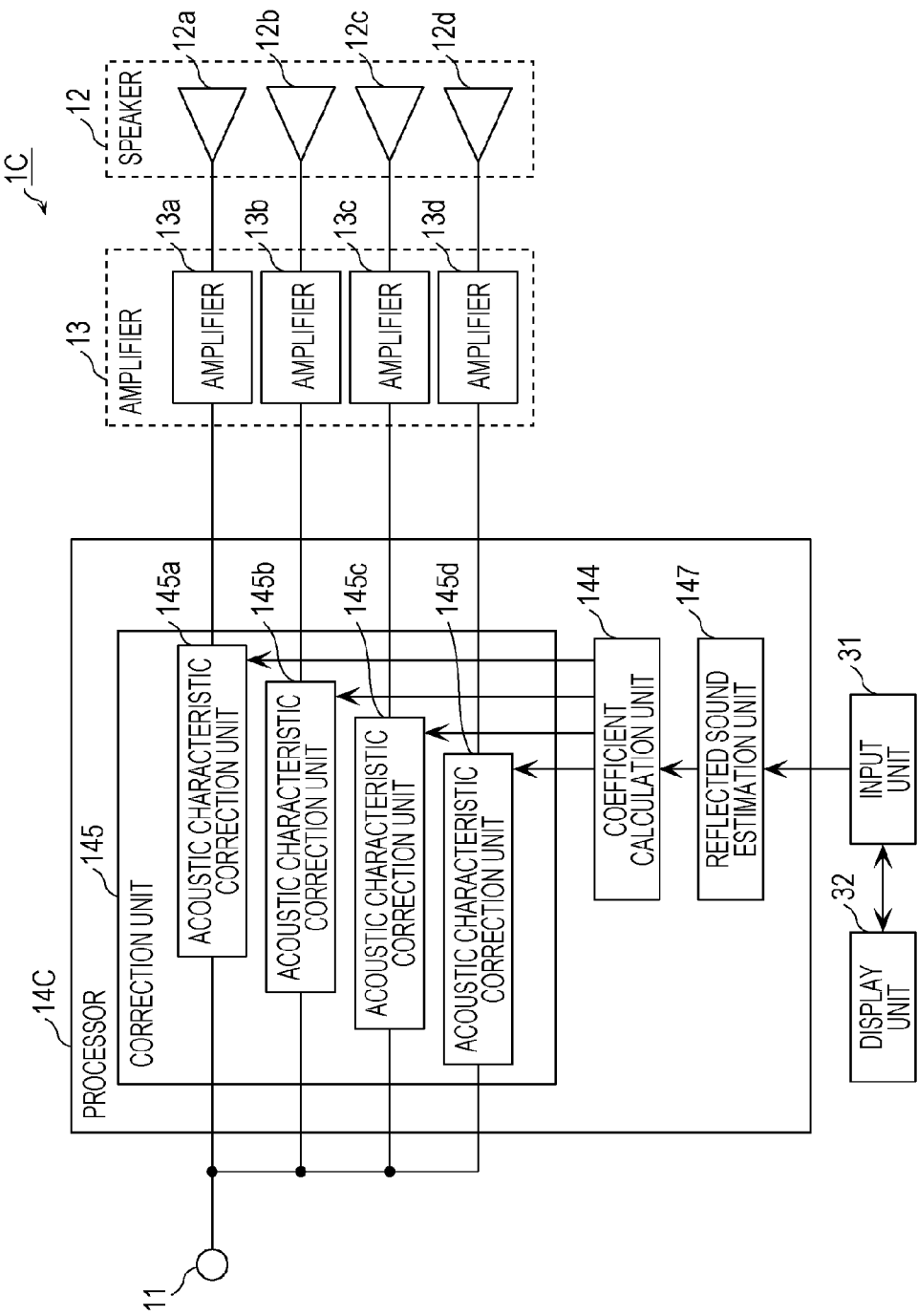
FIG. 17 illustrates an example of the configuration of a speaker system according to a third exemplary embodiment.

FIG. 17 illustrates an example of the configuration of a speaker system 1C according to the third exemplary embodiment. The same reference numerals are used to describe the elements that are identical to the elements of FIG. 1, and detailed description of the elements is not repeated. Unlike the speaker system 1 illustrated in FIG. 1, the speaker system 1C according to the present exemplary embodiment includes a processor 14C having a different configuration. The speaker system 1C does not include the input signal switching unit 15 and the measurement microphone 16, and the speaker system 1C additionally includes an input unit 31 and a display unit 32. Unlike the processor 14 according to the first exemplary embodiment, the processor 14C according to the present exemplary embodiment does not include the control unit 141, the measurement signal generating unit 142, and the reflected sound information acquiring unit 143 and additionally includes a reflected sound estimation unit 147. The difference from the first exemplary embodiment is mainly described below.

The display unit 32 is, for example, a touch panel display. The display unit 32 displays, in a display screen thereof, the shape of a room and the position of the speaker in the form of an image. The shape of a room and the position of the speaker displayed on the display screen can be changed by the user (the listener). The display unit 32 is connected to the input unit 31. The changed shape of a room and position of the speaker displayed in the display screen are output to the input unit 31.

The input unit 31 receives the distance between each of the speakers (the speakers 12a to 12d) that form the speaker 12 and an object located in the sound radiation direction of the speaker. Note that the object is a sound-reflecting object, such as a wall. According to the present exemplary embodiment, the user (the listener) changes the position and orientation of the speaker displayed in the display screen of the display unit 32 and specifies the listening position. Thus, the input unit 31 receives the input information regarding the distance between the speaker and the wall and the listening position. Note that the user (the listener) may directly input, to the input unit 31, the positions of the speakers (the speakers 12a to 12d) that form the speaker 12, the distance between each of the speakers (the speakers 12a to 12d) and a wall, the distance between each of the speakers (the speakers 12a to 12d) and the listening position, the distance between a wall and the listening position, and the reflection coefficient of the wall.

The reflected sound estimation unit 147 calculates, as the reflected sound information, estimated reflected sound, which is the sound played back by each of the speakers (the speakers 12a to 12d) that form the speaker 12 and reflected off the object, using the distance between the speaker and the wall and the listening position received by the input unit 31. More specifically, the reflected sound estimation unit 147 calculates, as the estimated reflected sound, the direct sound from each of the speakers (the speakers 12a to 12d) that form the speaker 12 and the time and magnitude of the sound reflected off the wall on the basis of the information received by the input unit 31.

Subsequently, the coefficient calculation unit 144 calculates a correction coefficient used to correct the acoustic characteristics of each of the speakers (speakers 12a to 12d) that form the speaker 12 on the basis of the estimated reflected sound calculated by the reflected sound estimation unit 147.

Signal Processing Method for Use in Speaker System

Figure 18:
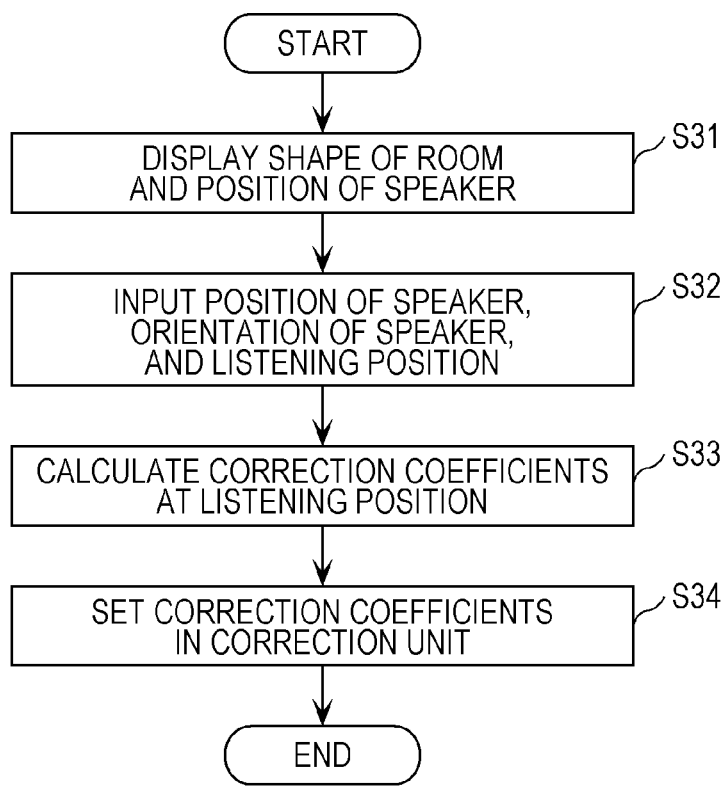
FIG. 18 is a flowchart of a signal processing method for use in the speaker system according to the third exemplary embodiment.
Figure 19:
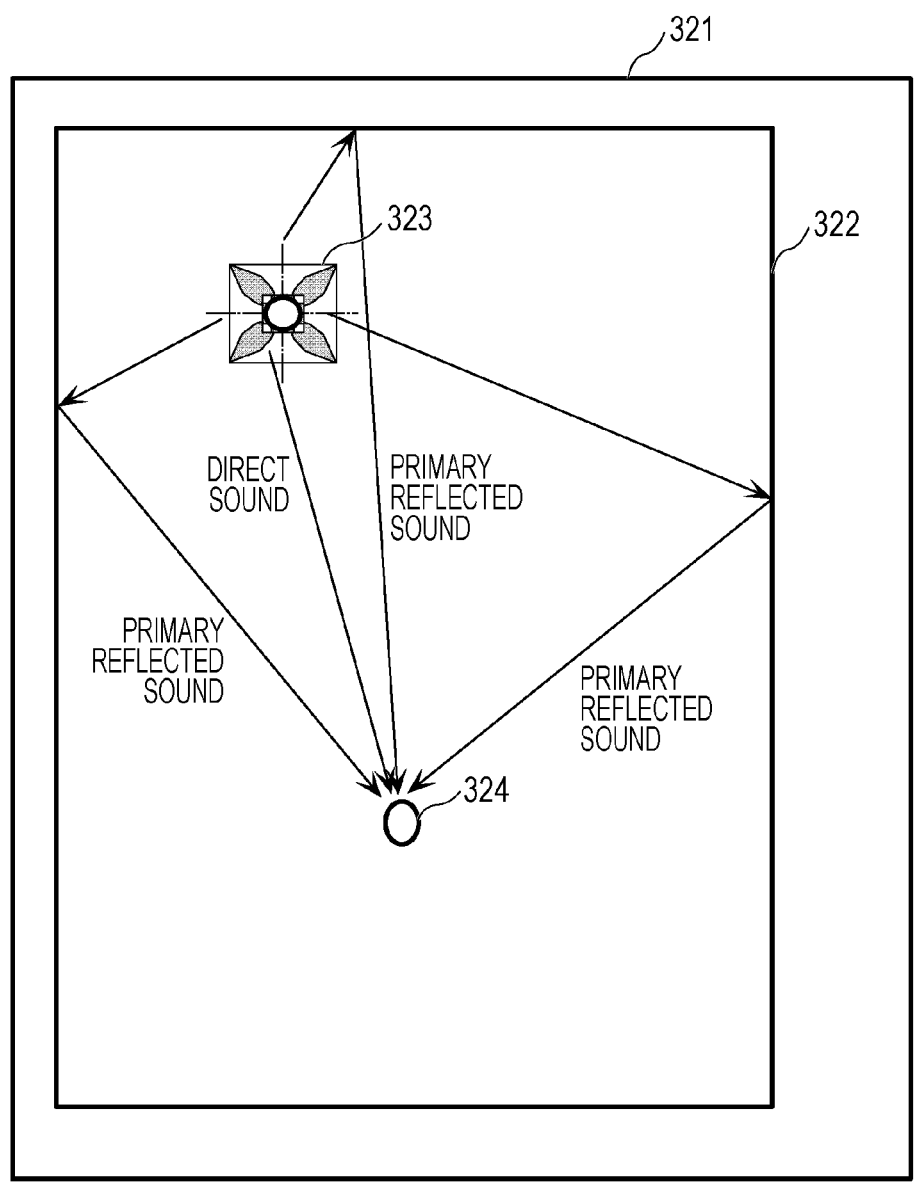
FIG. 19 illustrates an example of a display screen of a display unit according to the third exemplary embodiment.

The signal processing method for use in the speaker system 1C having the above-described configuration is described below. FIG. 18 is a flowchart of the signal processing method for use in the speaker system 1C according to the present exemplary embodiment. FIG. 19 illustrates an example of the display screen of the display unit 32 according to the present exemplary embodiment.

The display unit 32 displays, in the display screen, the shape of the room and the position of the speaker in the form of an image first (step S31). In the example illustrated in FIG. 19, the display unit 32 displays, in a display screen 321, the shape of a room 322 (e.g., a rectangle) and the position of a speaker 323. Note that the room 322 corresponds to the room 2 according to the first and second exemplary embodiments, and the room 322 is a room virtually displayed in the display screen 321. The speaker 323 corresponds to the speaker 12 according to the first and second exemplary embodiments, and the speaker 323 is a speaker virtually displayed in the display screen 321.

Subsequently, the user inputs the position of the speaker 12, the orientation of the speaker 12, and the listening position (step S32). In the example illustrated in FIG. 19, the user changes the position of the speaker 323 in the room 322 displayed in the display screen 321 so that the specified position matches the position of the speaker 12 in the actual room 2. In addition, the user specifies a listening position 324 in the room 322 displayed in the display screen 321 so that the specified position matches the listening position in the actual room 2. Note that the user may further input, for example, the reflection coefficient of the wall of the room 322 to the input unit 31.

Subsequently, the processor 14C of the speaker system 1C causes the coefficient calculation unit 144 to calculate the correction coefficient at the listening position input in step S32 (step S33) and causes the correction unit 145 to set up the calculated correction coefficient (step S34).

More specifically, the processor 14C of the speaker system 1C causes the reflected sound estimation unit 147 to calculate an estimated reflected sound, which is the sound played back by each of the speakers (the speakers 12a to 12d) that form the speaker 323 and reflected off the object, using the information input in step S32 first. Subsequently, the processor 14C of the speaker system 1C causes the coefficient calculation unit 144 to calculate a correction coefficient at the listening position 324 input in step S32 using the estimated reflected sound calculated by the reflected sound estimation unit 147 and the listening position 324 input in step S32. The coefficient calculation unit 144 calculates a correction coefficient to be set in the correction unit 145 while taking into account the effect of the reflected sound at the listening position 324 on the basis of the direct sound of the speakers (the speakers 12a to 12d) that form the speaker 323 at the listening position 324 (the direct sound calculated by the reflected sound estimation unit 147 as the estimated reflected sound) and the time and magnitude of the sound reflected off the wall of the room 322. Thereafter, the coefficient calculation unit 144 sets up the calculated correction coefficient in the correction unit 145.

Advantages

As described above, according to the present exemplary embodiment, the signal processing method and the speaker system capable of reducing the effect of the reflected sound on the acoustic characteristics can be provided. More specifically, the signal processing method and the speaker system according to the present exemplary embodiment can reduce the effect of the sound reflected off a sound-reflecting object, such as a wall, while maintaining the wide directivity so that direct sound in the high frequency band dominantly reaches the listener. Accordingly, the listener can hear the sound with excellent acoustic characteristics.

While the signal processing method and the speaker system according to one or more aspects of the present disclosure have been described with reference to the exemplary embodiments, the present disclosure is not limited thereto. A variety of modifications of the exemplary embodiments that are conceivable by those skilled in the art and an embodiment configured by combining constituent elements of different embodiments may be encompassed in the scope of one or a plurality of aspects of the present disclosure without departing from the spirit and scope of the present disclosure. For example, the following cases can be encompassed in the present disclosure.

(1) More specifically, each of the above-described units is a computer system including a microprocessor, a read only memory (ROM), a random access memory (RAM), a hard disk unit, a display unit, a keyboard, and a mouse. The RAM or the hard disk unit stores a computer program. By causing the microprocessor to operate in accordance with the computer program, each of the units achieves its function. Note that the computer program is formed by combining a plurality of instruction codes each serving as a command for a computer.

(2) Some or all of the constituent elements that constitute each of the above-described units may be formed from a single system large scale integration (system LSI). The system LSI is a super multifunctional LSI produced by integrating a plurality of constituent units into one chip. More specifically, the system LSI is a computer system including, for example, a microprocessor, a ROM, and a RAM. The RAM has a computer program stored therein. The microprocessor operates in accordance with the computer program and, thus, the system LSI realizes the function.

(3) Some or all of the constituent elements that constitute each of the above-described units may be formed from an IC card or a single module removable from the unit. The IC card or the module is a computer system formed from, for example, a microprocessor, a ROM, and a RAM. The IC card or the module may include the above-described super multifunctional LSI. When the microprocessor operates in accordance with the computer program, the IC card or the module provides its function. The IC card or the module may be tamper resistant.

(4) The present disclosure may be the above-described methods. Alternatively, the present disclosure may be a computer program that realizes the methods using a computer or a digital signal formed from the computer program.

(5) Alternatively, the present disclosure may be the computer program or the digital signal recorded in a computer-readable storage medium, such as a flexible disk, a hard disk, a CD-ROM, an MO, a DVD, a DVD-ROM, a DVD-RAM, a BD (Blu-ray (trade name) Disc), or a semiconductor memory. In addition, the present disclosure may be the above-described digital signal recorded in such a storage medium.

(6) Alternatively, the present disclosure may be the computer program or the digital signal transmitted via, for example, an electric communication network, a wireless or wired communication network, a network represented by the Internet, or data broadcasting.

(7) Alternatively, the present disclosure may be a computer system including a microprocessor and a memory. The memory may store the above-described computer program therein, and the microprocessor may operate in accordance with the computer program.

(8) Still alternatively, the present disclosure may be realized by another independent computer system by recording the program or the digital signal in the storage medium and transferring the storage medium or transferring the program or the digital signal via, for example, the above-mentioned network.

The present disclosure is applicable to a signal processing method and a speaker system and, in particular, to a signal processing method and a speaker system for use in audio devices that plays back music with excellent acoustic characteristics in a wide area of a music playback space or equipment that plays back music with the same acoustic characteristics for a large number of people in a small space, such as a schoolroom or a cafe.

What is claimed is:

1. A method for controlling a speaker system, the speaker system including a plurality of speakers each having predetermined directivity, the method comprising:
    acquiring, using a measurement microphone, reflected sound information related to an effect of sounds that are played back by the plurality of speakers and that are reflected from an object;
    calculating, by a processor of the speaker system, correction coefficients used to correct acoustic characteristics of the plurality of speakers on the basis of the acquired reflected sound information; and
    correcting, by the processor, the acoustic characteristics of the plurality of speakers using the calculated correction coefficients,
    wherein calculating the correction coefficients comprises estimating a shape of a room having the plurality of speakers disposed therein, the room defined by a plurality of walls, estimating speaker positions at which the speakers are disposed, and calculating the correction coefficient of each of the plurality of speakers using the estimated shape of the room and the estimated speaker positions,
    wherein, in the estimating the shape of the room and in the estimating the speaker positions, a listening position in the shape of the room is further estimated using the estimated shape of the room and the estimated speaker positions, and response times of sounds played back by the plurality of speakers are estimated, and
    wherein the method further comprises
        adding reverb of the sounds played back by the plurality of speakers at the listening position by controlling a delay time and a sound level of the sound radiating from the speaker, of the plurality of speakers, that faces a wall of the room, on the basis of the estimated shape of the room, the estimated speaker positions, the estimated listening position, and the estimated response times.

2. The method according to claim 1,
wherein the speaker system further includes a woofer that differs from the plurality of speakers, and
wherein the method further comprises
    dividing a frequency range of a signal input to be played back by the plurality of speakers and the woofer into at least a low frequency band and a high frequency band,
    wherein in the dividing a frequency range, a signal in the high frequency band is output to the plurality of speakers, and a signal in the low frequency band is output to the woofer.

3. The method according to claim 1,
wherein the acquiring reflected sound information comprises receiving input of a distance between each of the plurality of speakers and the object in a sound radiation direction of the speaker, and input of a listening position and calculating, as the reflected sound information, estimated reflected sound representing the sound played back by each of the plurality of speakers and reflected from the object using the received distances and the received listening position.

4. The method according to claim 1,
wherein the acoustic characteristics of the plurality of speakers include at least one of a phase, a sound level, and a frequency characteristic of each of the plurality of speakers.

5. A speaker system, comprising:
a plurality of speakers, wherein each of speakers has a predetermined directivity;
a processor;
a memory having a computer program stored thereon, the computer program causing the processor to execute operations including
    acquiring, using a measurement microphone, reflected sound information regarding an effect of sounds that are played back by each of the plurality of speakers and that are reflected from an object;

calculating correction coefficients used to correct acoustic characteristics of the plurality of speakers on the basis of the acquired reflected sound information; and correcting the acoustic characteristics of the plurality of speakers using the calculated correction coefficients, wherein calculating the correction coefficients comprises estimating a shape of a room having the plurality of speakers disposed therein, the room defined by a plurality of walls, estimating speaker positions at which the speakers are disposed, and calculating the correction coefficient of each of the plurality of speakers using the estimated shape of the room and the estimated speaker positions, wherein, in the estimating the shape of the room and in the estimating the speaker positions, a listening position in the shape of the room is further estimated using the estimated shape of the room and the estimated speaker positions, and response times of sounds played back by the plurality of speakers are estimated, and wherein the operations further comprise adding reverb of the sounds played back by the plurality of speakers at the listening position by controlling a delay time and a sound level of the sound radiating from the speaker, of the plurality of speakers, that faces a wall of the room, on the basis of the estimated shape of the room, the estimated speaker positions, the estimated listening position, and the estimated response times.

6. A non-transitory computer readable medium storing a program for controlling a speaker system including a plurality of speakers each having a predetermined directivity, the computer including a processor and a memory, the program, when executed by the computer, causing the computer to perform processes including:

acquiring, using a measurement microphone, reflected sound information related to an effect of sounds that are played back by the plurality of speakers and that are reflected from an object;

calculating, by a processor of the speaker system, correction coefficients used to correct acoustic characteristics of the plurality of speakers on the basis of the acquired reflected sound information; and correcting, by the processor of the speaker system, the acoustic characteristics of the plurality of speakers using the calculated correction coefficients, wherein calculating the correction coefficients comprises estimating a shape of a room having the plurality of speakers disposed therein, the room defined by a plurality of walls, estimating speaker positions at which the speakers are disposed, and calculating the correction coefficient of each of the plurality of speakers using the estimated shape of the room and the estimated speaker positions, wherein, in the estimating the shape of the room and in the estimating the speaker positions, a listening position in the shape of the room is further estimated using the estimated shape of the room and the estimated speaker positions, and response times of sounds played back by the plurality of speakers are estimated, and wherein the processes further comprise adding reverb of the sounds played back by the plurality of speakers at the listening position by controlling a delay time and a sound level of the sound radiating from the speaker, of the plurality of speakers, that faces a wall of the room, on the basis of the estimated shape of the room, the estimated speaker positions, the estimated listening position, and the estimated response times.

7. A method for controlling a speaker system, the speaker system including a plurality of speakers each having predetermined directivity, the method comprising:

acquiring, using a measurement microphone, reflected sound information related to an effect of sounds that are played back by the plurality of speakers and that are reflected from an object;

calculating, by a processor of the speaker system, correction coefficients used to correct acoustic characteristics of the plurality of speakers on the basis of the acquired reflected sound information; and correcting, by the processor, the acoustic characteristics of the plurality of speakers using the calculated correction coefficients, wherein the acquiring reflected sound information includes receiving input of a distance between each of the plurality of speakers and the object in a sound radiation direction of the speaker, receiving input of a listening position, and calculating, as the reflected sound information, acquired reflected sound representing the sound played back by each of the plurality of speakers and reflected from the object, using the received distances and the received listening position.

8. A speaker system, comprising:

a plurality of speakers, wherein each of the plurality of speakers has a predetermined directivity;

a processor;

a memory having a computer program stored thereon, the computer program causing the processor to execute operations including acquiring, using a measurement microphone, reflected sound information regarding an effect of sounds that are played back by each of the plurality of speakers and that are reflected from an object;

calculating correction coefficients used to correct acoustic characteristics of the plurality of speakers on the basis of the acquired reflected sound information; and correcting the acoustic characteristics of the plurality of speakers using the calculated correction coefficients, wherein the acquiring reflected sound information includes receiving an input of a distance between each of the plurality of speakers and the object in a sound radiation direction of the speaker, receiving an input of a listening position, and calculating, as the reflected sound information, acquired reflected sound representing the sound played back by each of the plurality of speakers and reflected from the object, using the received distances and the received listening position.

9. A non-transitory computer readable medium storing a program for controlling a speaker system including a plurality of speakers each having a predetermined directivity, the computer including a processor and a memory, the program, when executed by the computer, causing the computer to perform processes according to claim 1.

10. A non-transitory computer readable medium storing a program for controlling a speaker system including a plurality of speakers each having a predetermined directivity, the computer including a processor and a memory, the program, when executed by the computer, causing the computer to perform processes according to claim 7.

* * * * *